(12) United States Patent
Sugishita et al.

(10) Patent No.: US 12,503,770 B2
(45) Date of Patent: *Dec. 23, 2025

(54) SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Masashi Sugishita, Toyama (JP); Masaaki Ueno, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 221 days.

This patent is subject to a terminal disclaimer.

(21) Appl. No.: 18/449,750

(22) Filed: Aug. 15, 2023

(65) Prior Publication Data

US 2023/0383411 A1 Nov. 30, 2023

Related U.S. Application Data

(63) Continuation of application No. 16/425,652, filed on May 29, 2019, now Pat. No. 11,761,087, which is a
(Continued)

(30) Foreign Application Priority Data

Nov. 30, 2016 (JP) ................... 2016-232813

(51) Int. Cl.
*C23C 16/52* (2006.01)
*C23C 16/46* (2006.01)
(Continued)

(52) U.S. Cl.
CPC ............ *C23C 16/52* (2013.01); *C23C 16/466* (2013.01); *H01L 21/02* (2013.01); *H01L 21/31* (2013.01);
(Continued)

(58) Field of Classification Search
None
See application file for complete search history.

(56) References Cited

U.S. PATENT DOCUMENTS

| 5,593,608 A | 1/1997 | Suzuki |
| 2002/0025688 A1 | 2/2002 | Kato |

(Continued)

FOREIGN PATENT DOCUMENTS

| JP | 09-190982 A | 7/1997 |
| JP | 2002-075890 A | 3/2002 |

(Continued)

OTHER PUBLICATIONS

Office Action in corresponding Korean Patent Application No. 10-2019-7015248, ,dated Sep. 28, 2020, with English translation.
(Continued)

*Primary Examiner* — Charles Capozzi
(74) *Attorney, Agent, or Firm* — Edell, Shapiro & Finnan, LLC

(57) ABSTRACT

According to one aspect of the technique of the present disclosure, there is provided a substrate processing apparatus including: a heater heating a substrate in a reaction tube; a temperature controller controlling the heater; a valve controller adjusting an opening degree of a control valve to adjust a gas flow rate; and a main controller instructing a recipe including: (a) elevating an inner temperature of the reaction tube to a predetermined temperature at an elevating rate; (b) processing the substrate at the predetermined temperature; and (c) lowering the inner temperature of the reaction tube at a lowering rate. The main controller controls the temperature controller and the valve controller so that the inner temperature of the reaction tube changes in (a) or (c) at the elevating or lowering rate by heating in parallel with cooling by the gas supplied through the control valve.

17 Claims, 12 Drawing Sheets

Related U.S. Application Data continuation of application No. PCT/JP2017/032242, filed on Sep. 7, 2017.

(51) Int. Cl.
*H01L 21/02* (2006.01)
*H01L 21/31* (2006.01)
*H01L 21/67* (2006.01)

(52) U.S. Cl.
CPC .. *H01L 21/67017* (2013.01); *H01L 21/67109* (2013.01); *H01L 21/67248* (2013.01)

(56) References Cited

U.S. PATENT DOCUMENTS

| | | |
|---|---|---|
| 2004/0238649 A1 | 12/2004 | Ohminami |
| 2008/0014351 A1 | 1/2008 | Inoue |
| 2012/0224898 A1 | 9/2012 | Amita et al. |

FOREIGN PATENT DOCUMENTS

| | | |
|---|---|---|
| JP | 2003-031510 A | 1/2003 |
| JP | 2006-222327 A | 8/2006 |
| JP | 2011-216854 A | 10/2011 |
| JP | 2014-209569 A | 11/2014 |

OTHER PUBLICATIONS

Office Action in corresponding Japanese Application No. 201-553667, dated Apr. 14, 2020, with English translation.
Decision to Grant by JPO (mailed Oct. 6, 2020).
English translation of JPH09190982.

SUBSTRATE PROCESSING APPARATUS AND NON-TRANSITORY COMPUTER-READABLE RECORDING MEDIUM

CROSS REFERENCE TO RELATED APPLICATIONS

This non-provisional U.S. patent application is a continuation of U.S. patent application Ser. No. 16/425,652, filed May 29, 2019, which claims priority under 35 U.S.C. § 119 to International Application No. PCT/JP2017/032242, filed on Sep. 7, 2017, in the WIPO, and Japanese Patent Application No. 2016-232813, filed on Nov. 30, 2016, in the Japanese Patent Office, the entire contents of which are hereby incorporated by reference.

TECHNICAL FIELD

The present disclosure relates to a substrate processing apparatus and a non-transitory computer-readable recording medium.

BACKGROUND

A semiconductor manufacturing apparatus is an example of a substrate processing apparatus, and a vertical type semiconductor manufacturing apparatus (hereinafter, also referred to as a "vertical type apparatus") is an example of the semiconductor manufacturing apparatus. A boat serving as a substrate retainer capable of supporting substrates (hereinafter, also referred to as "wafers") in multiple stages is transferred (loaded) into a process chamber in a reaction tube of the vertical type apparatus while the substrates are supported by the boat, and the substrates supported by the boat are processed at a predetermined temperature while a temperature control is performed in a plurality of zones of the reaction tube. Heretofore, according to a temperature control of a heater of the vertical type apparatus, the heater is turned off when a temperature of reaction tube is lowered. However, recently it has become an active trend to improve the temperature lowering characteristics after the substrates are processed.

According to one related art, there is disclosed a technique capable of changing a flow of a cooling gas supplied by a cooling part by opening and closing an opening/closing valve (on-off valve) when a film is formed on the substrates, when the temperature of the reaction tube is lowered and when a temperature recovery is performed. According to another related art, there is disclosed a technique capable of adjusting (setting) a temperature lowering rate of each component of the heater by changing the number and arrangement of outlet holes. However, when flow rate of the cooling gas of the cooling part described above is controlled, the reaction tube cannot be uniformly cooled during a rapid cooling. Therefore, the change in the temperature lowering rate for each of the plurality of the zones may be different, and a temperature history between the zones may be different.

On the other hand, it is a recent demand to increase a temperature elevating rate in order to improve the productivity. This may cause a problem that the temperature elevating rate for each of the plurality of the zones may be different, which makes the temperature history different between the zones.

SUMMARY

Described herein is a technique (configuration) capable of improving a temperature deviation between zones.

According to one aspect of the technique of the present disclosure, there is provided a substrate processing apparatus including: a heater configured to heat a substrate in a reaction tube; a temperature controller configured to control the heater such that the substrate is maintained at a predetermined temperature while an operation amount (Z) outputted to the heater is being calculated; a valve controller configured to adjust an opening degree of a control valve to adjust a flow rate of a gas supplied toward the reaction tube; and a main controller configured to output a setting value to at least one of the temperature controller or the valve controller to control an inner temperature of the reaction tube, wherein the valve controller includes: a subtractor configured to calculate a deviation (Zd) by subtracting the operation amount (Z) from the setting value set by the main controller; and an opening degree converter configured to calculate an opening degree (X') based on an operation result obtained by performing an operation using the deviation (Zd), and wherein the opening degree (X') based on the operation result is controlled such that the deviation (Zd) becomes zero.

DETAILED DESCRIPTION

Embodiments

Hereinafter, one or more embodiments (hereinafter, collectively referred to as "embodiments") according to the technique will be described with reference to the drawings.

Figure 1:
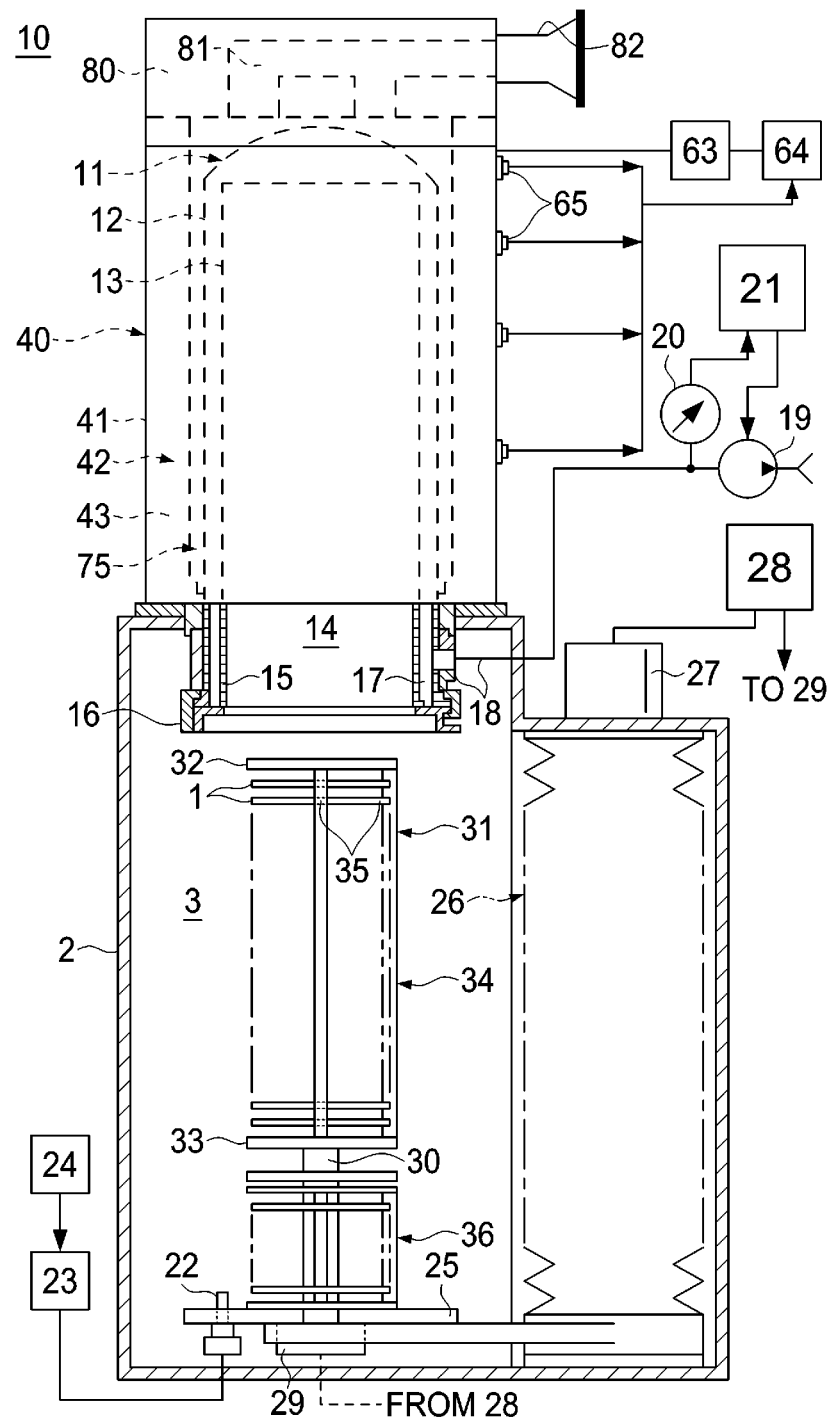
FIG. 1 schematically illustrates a vertical cross-section of a substrate processing apparatus according to one or more embodiments described herein.
Figure 2:
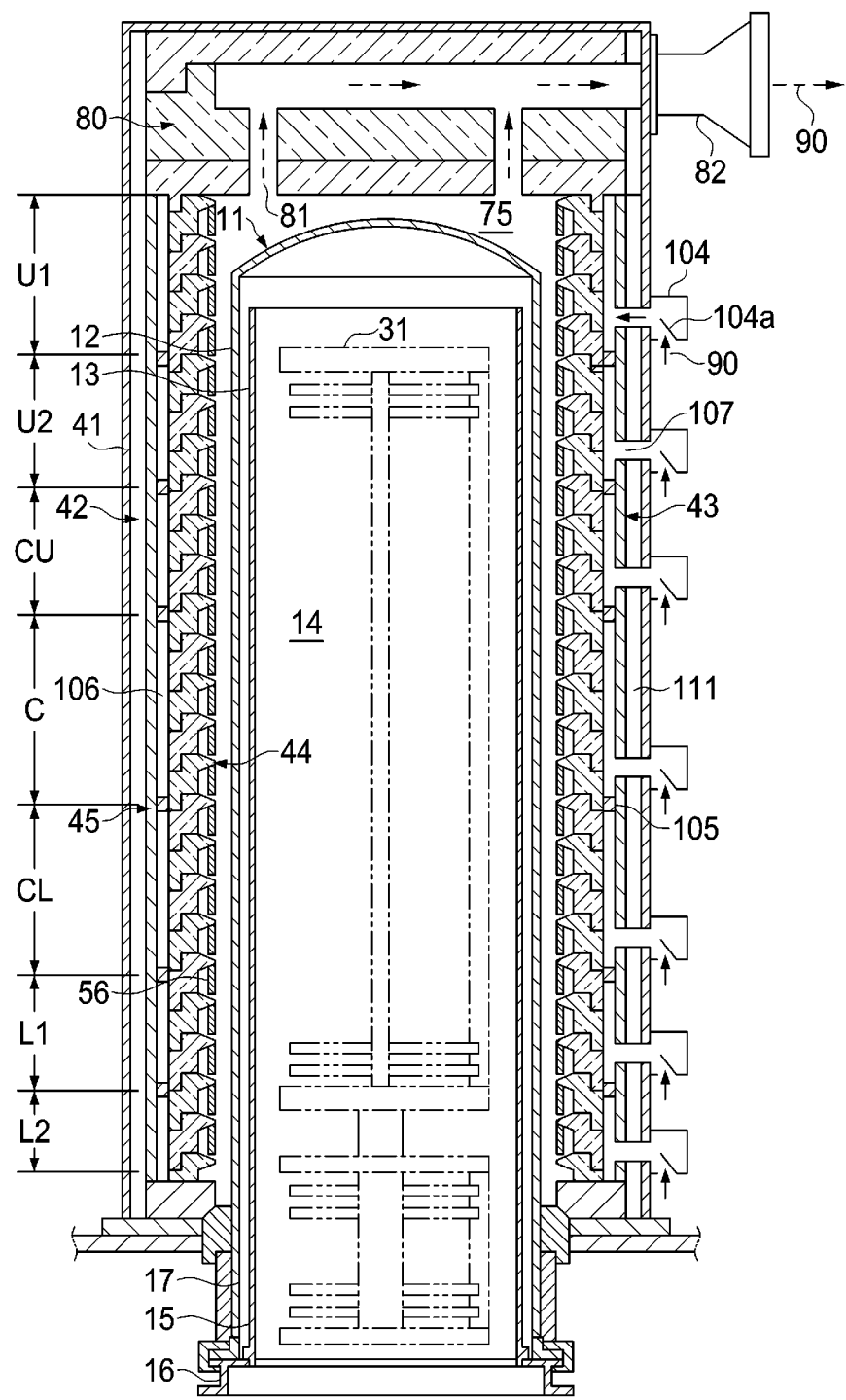
FIG. 2 schematically illustrates a cross-sectional structure in the vicinity of a reaction tube of the substrate processing apparatus according to the embodiments described herein.

As shown in FIGS. 1 and 2, a substrate processing apparatus 10 according the embodiments is configured as a processing apparatus capable of performing a film-forming process of a method of manufacturing a semiconductor device.

As shown in FIG. 1, the substrate processing apparatus 10 includes a process tube 11 serving as a vertical reaction tube. Hereinafter, the process tube 11 is referred to as the reaction tube 11. The reaction tube 11 includes an outer tube 12 and an inner tube 13. The outer tube 12 is provided concentrically with the inner tube 13. For example, the outer tube 12 is made of quartz (SiO2), and is integrally formed in a cylindrical shape with a closed upper end and an open lower end. The inner tube 13 is cylindrical with open upper and lower ends. A process chamber 14 where a boat 31 described later is loaded is defined by a hollow portion of the inner tube 13. A lower end opening of the inner tube 13 serves as a furnace opening portion 15. The boat 31 may be loaded or unloaded into the process chamber 14 or out of process chamber 14 through the furnace opening portion 15. As will be described later, the boat 31 is configured to accommodate wafers including a wafer (also referred to as a "substrate") 1 while the wafers are aligned. Therefore, an inner diameter of the inner tube 13 is greater than a maximum outer diameter (for example, a diameter of 300 mm) of the wafer 1 to be processed.

A lower end portion between the outer tube 12 and the inner tube 13 is airtightly sealed by a manifold 16 formed in a substantially cylindrical shape. For example, in order to replace the outer tube 12 or the inner tube 13, the manifold 16 is detachably attached to the outer tube 12 and the inner tube 13, respectively. By supporting the manifold 16 on a housing 2 of the substrate processing apparatus 10 such as a CVD apparatus, the reaction tube 11 is vertically provided on the manifold 16. Hereinafter, in the following drawings, only the outer tube 12 may be shown as the reaction tube 11.

An exhaust path 17 is formed by a gap between the outer tube 12 and the inner tube 13. The exhaust path 17 has a circular ring shape with a constant transverse cross section. As shown in FIG. 1, one end of an exhaust pipe 18 is connected to an upper portion of a side wall of the manifold 16, and the exhaust pipe 18 communicates with a lowermost end portion of the exhaust path 17. An exhaust apparatus 19 controlled by a pressure controller 21 is connected to the other end of the exhaust pipe 18. A pressure sensor 20 is connected to an intermediate portion of the exhaust pipe 18. The pressure controller 21 is configured to feedback-control the exhaust apparatus 19 based on the measured pressure by the pressure sensor 20.

A gas introduction pipe 22 is provided below the manifold 16 so as to communicate with the furnace opening portion 15 of the inner tube 13. A source gas supply device and an inert gas supply device are connected to the gas introduction pipe 22. Hereinafter, the source gas supply device and the inert gas supply device are collectively referred to simply as a gas supply device 23. The gas supply device 23 is controlled by a gas flow rate controller 24. The gas supplied into the furnace opening portion 15 through the gas introduction pipe 22 flows through the process chamber 14 of the inner tube 13, and is exhausted through the exhaust path 17 and the exhaust pipe 18.

A seal cap 25 capable of airtightly sealing a lower end opening of the manifold 16 is provided under the manifold 16. The seal cap 25 may be in contact with the lower end opening of the manifold 16. The seal cap 25 is disk-shaped and a diameter of the seal cap 25 is substantially equal to an outer diameter of the manifold 16. The seal cap 25 is vertically moved up and down by a boat elevator 26 provided in a standby chamber 3 of the housing 2. The boat elevator 26 includes components such as a motor-driven feed screw shaft device and a bellows. A motor 27 of the boat elevator 26 is controlled by an operation controller 28. A rotating shaft 30 is provided on a center line of the seal cap 25 so as to be rotatably supported. The rotating shaft 30 is configured to be rotationally driven by a rotating mechanism 29 serving as a motor controlled by the operation controller 28. The boat 31 is vertically supported at an upper end of the rotating shaft 30.

The boat 31 includes a pair of end plates (that is, an upper end plate 32 and a lower end plate 33) and three support columns 34 vertically provided between the upper end plate 32 and the lower end plate 33 and connecting the upper end plate 32 and the lower end plate 33. Support recesses 35 are engraved at each of the three support columns 34 at equal intervals in a lengthwise direction of each of the three support columns 34. Support recesses 35 of the same stage of the three support columns 34 face one another. By inserting the wafers including the wafer 1 to the support recesses 35 of the three support columns 34, the boat 31 supports the wafers vertically arranged in multiple stages while the wafers being in horizontal orientation. A heat insulating cap portion 36 is provided under the boat 31 to surround the rotating shaft 30. By supporting the boat 31 while the boat 31 is lifted from an upper surface of the seal cap 25, the rotating shaft 30 is configured to separate a lower end of the boat 31 from the furnace opening portion 15 by an appropriate distance. The heat insulating cap portion 36 thermally insulates the vicinity of the furnace opening portion 15.

A heater (also referred to as a "heating device" or a "heater unit") 40 serving as a vertically provided heating mechanism is provided at an outside of the reaction tube 11. The heater 40 is provided concentrically with the reaction tube 11 and supported by the housing 2. The heater 40 includes a case 41. The case 41 is, for example, made of stainless steel (SUS). The case 41 is tubular with a closed upper end and an open lower end. Preferably, the case 41 is cylindrical. An inner diameter and an overall length of the case 41 are greater than an outer diameter and an overall length of the outer tube 12, respectively. According to the embodiments, for example, the case 41 may be divided into a plurality of control zones, for example, seven control zones U1, U2, CU, C, CL, L1 and L2, from an upper end toward a lower end of the heater 40 (that is, the case 41).

A heat insulating structure 42 according to the embodiments is provided on an inner side of the case 41 (that is, an inner side of the heater 40). The heat insulating structure 42 according to the embodiments is tubular. Preferably, the heat insulating structure 42 is cylindrical. A sidewall portion 43 of the cylindrical heat insulating structure 42 has a multi-layer structure. That is, the heat insulating structure 42 includes a sidewall outer layer 45 serving as an outer side layer of the sidewall portion 43 and a sidewall inner layer 44 serving as an inner side layer of the sidewall portion 43. Between the sidewall outer layer 45 and the sidewall inner layer 44, a plurality of boundary parts including a boundary part 105 configured to divide the sidewall portion 43 into a plurality of zones (regions) in a vertical direction, and a plurality of ring-shaped buffer parts including a ring-shaped buffer part 106 provided between the boundary parts adjacent to the boundary part are provided.

A plurality of check dampers including a check damper 104 serving as a back-diffusion prevention part is provided in each of the zones (regions) of the case 41. A plurality of back-diffusion prevention bodies including a back-diffusion prevention body 104a of the check damper 104 may be open or closed, respectively. Cooling air 90 may be supplied to the ring-shaped buffer part 106 serving as a buffer part through a gas introduction path 107 of a plurality of gas introduction paths by opening the back-diffusion prevention body 104a. When the cooling air 90 is not supplied from a gas source (not shown), the back-diffusion prevention body 104a is closed and serves as a lid. Accordingly, the back-diffusion prevention body 104a is formed so that an atmosphere of an internal space 75 does not flow backward. An opening pressure of the back-diffusion prevention body 104a may be changed according to each of the zones of the case 41. A heat insulating cloth 111, which is a blanket configured to absorb the thermal expansion of a metal, is provided between an outer circumferential surface of the sidewall outer layer 45 and an inner circumferential surface of the case 41.

As shown in FIG. 2, the cooling air 90 supplied to the ring-shaped buffer part 106 flows through a gas supply flow path 108 of a plurality of gas supply flow paths provided in the sidewall inner layer 44, and is supplied to the internal space 75 through an opening hole 110 of a plurality of opening holes. The opening hole 110 is a part of a supply path including the gas supply flow path 108.

As shown in FIGS. 1 and 2, a ceiling wall part 80 serving as a ceiling part is provided on an upper end of the sidewall portion 43 of the heat insulating structure 42. The ceiling wall part 80 covers the internal space 75 to close the internal space 75. An exhaust hole 81, which is a part of an exhaust path which exhausts the atmosphere of the internal space 75, is formed in the ceiling wall part 80 to have a ring-shape. A lower end of the exhaust hole 81, which is an upstream side end of the exhaust hole 81, communicates with the internal space 75. A downstream side end of the exhaust hole 81 is connected to an exhaust duct 82.

Hereinafter, the operation of the substrate processing apparatus 10 will be described.

As shown in FIG. 1, after a predetermined number of wafers including the wafer 1 are charged into the boat 31, the boat 31 charged with the wafers is elevated by elevating the seal cap 25 by the boat elevator 26, and is transferred (loaded) into the process chamber 14 of the inner tube 13 (boat loading). The seal cap 219 having reached an upper limit seals the inside of the reaction tube 11 by pressing on the manifold 16. The boat 31 is accommodated in the process chamber 14 while being supported by the seal cap 25.

Subsequently, the inside of the reaction tube 11 is exhausted by the exhaust pipe 18. A temperature controller 64 performs a sequence control to heat the inside of the reaction tube 11 to a target temperature by a side wall heating element 56. An error between an actually risen temperature inside the reaction tube 11 and the target temperature of the sequence control of the temperature controller 64 is corrected by a feedback control based on the measurement result of a thermocouple 65. In addition, the boat 31 is rotated by the motor 29.

When an inner pressure and an inner temperature of the reaction tube 11 and a rotation of the boat 31 are stabilized as a whole, a source gas is supplied into the process chamber 14 of the reaction tube 11 through the gas introduction pipe 22 by the gas supply device 23. The source gas supplied through the gas introduction pipe 22 flows in the process chamber 14 of the inner tube 13, and is exhausted through the exhaust path 17 and the exhaust pipe 18. When the source gas flows in the process chamber 14, a predetermined film is formed on the wafers including the wafer 1 caused by bringing the source gas into contact with the wafers heated to a predetermined process temperature.

When a predetermined process time has elapsed, a purge gas such as nitrogen gas is supplied into the reaction tube 11 through the gas introduction pipe 22 after the supply of the source gas (process gas) is stopped. At the same time, the cooling air 90 serving as a cooling gas is supplied to the gas introduction path 107 through an inlet pipe 101 of a plurality of inlet pipes and the check damper 104 serving as the back-diffusion prevention part. The cooling air 90 supplied to the gas introduction path 107 is temporarily stored in the ring-shaped buffer part 106 serving as a ring-shaped duct, and ejected into the internal space 75 through the gas supply flow path 108 via the opening hole 110 of the opening holes serving as a plurality of cooling gas supply ports. The cooling air 90 ejected into the internal space 75 via the opening hole 110 is then exhausted through the exhaust hole 81 and the exhaust duct 82.

The entirety of the heater 40 is forced to be cooled by the flow of the cooling air 90 as described above. Therefore, the heat insulating structure 42 is rapidly cooled together with the reaction tube 11 with a fast cooling rate (speed). Since the internal space 75 is isolated from the process chamber 14, the cooling air 90 can be used as the cooling gas. However, an inert gas such as nitrogen gas may be used as the cooling gas in order to further enhance the cooling effect or to prevent the corrosion of the heating element 56 at high temperature due to impurities contained in the air.

After the temperature of the process chamber 14 is lowered to a predetermined temperature, the boat 31 supported by the seal cap 25 is lowered by the boat elevator 26 and transferred (unloaded) out of the process chamber 14 (boat unloading).

The film-forming process on the wafers including the wafer 1 is performed by the substrate processing apparatus 10 by performing the above-described operation.

Figure 3:
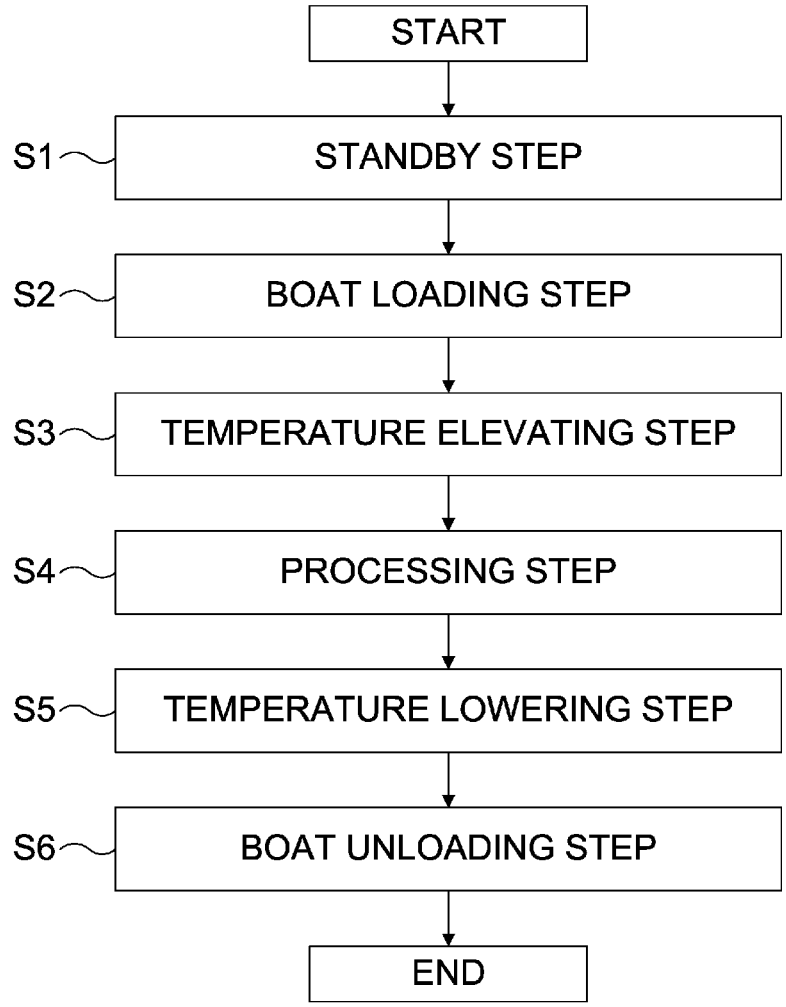
FIG. 3 is a flowchart schematically illustrating an example of processes relating to a temperature in a film-forming process according to the embodiments described herein.
Figure 4:
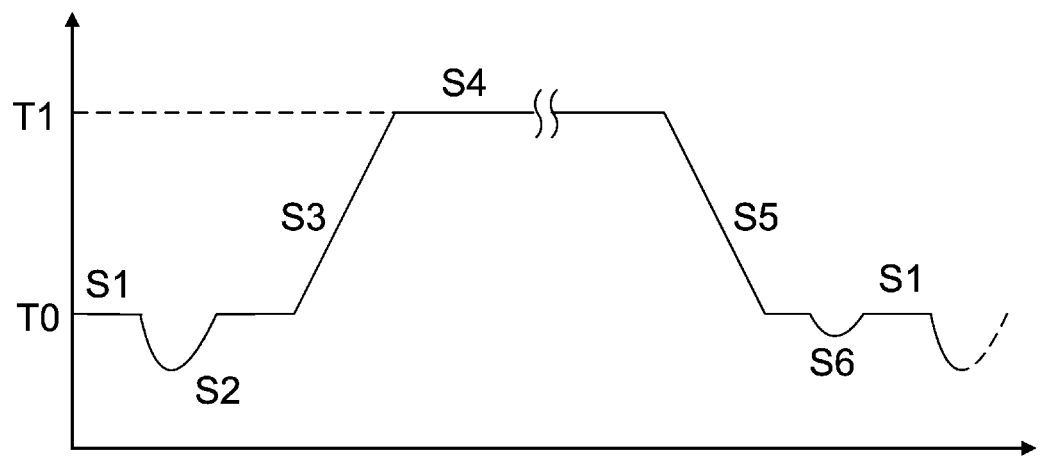
FIG. 4 schematically illustrates a change of an inner temperature of a furnace of the substrate processing apparatus in the flowchart shown in FIG. 3.

Hereinafter, an example of processes performed by the substrate processing apparatus 10 will be described with reference to FIGS. 3 and 4. Reference characters 51, S2, S3, S4, S5 and S6 shown in FIG. 4 indicate that the respective steps S1, S2, S3, S4, S5 and S6 in FIG. 3 are performed.

The step S1 (standby step) is a process of stabilizing an inner temperature of a furnace of the substrate processing apparatus 10 (that is, an inner temperature of the reaction tube 11) at a relatively low temperature T0. In the step S1, the wafer 1 has not yet been inserted into the furnace.

The step S2 (boat loading step) is a process of inserting (loading) the wafer 1 supported by the boat 31 into the furnace. The temperatures of the boat 31 and the wafer 1 are lower than the temperature T0 of the furnace when the wafer 1 is inserted into the furnace, and as a result of inserting the wafer 1 supported by the boat 31 into the furnace, an outer atmosphere of the furnace (room temperature) is introduced into the furnace. Therefore, the inner temperature of the furnace temporarily falls below the temperature T0. However, the inner temperature of the furnace is stabilized again at the temperature T0 after some time by a temperature control using a multi-cooling part of the embodiments described later.

The step S3 (temperature elevating step) is a process of gradually elevating the inner temperature of the furnace from the temperature T0 to a target temperature T1 for subjecting the wafer 1 to a predetermined process. By elevating the inner temperature of the furnace from the temperature T0 to the target temperature T1 by the temperature control using a multi-cooling part of the embodiments described later, it is possible to suppress an overshoot around the target temperature T1 to a low level.

The step (processing step) S4 is a process of maintaining and stabilizing the inner temperature of the furnace (that is, the inner temperature of the reaction tube 11) at the target temperature T1 in order to subject the wafer 1 to the predetermined process.

The step S5 (temperature lowering step) is a process of gradually lowering the inner temperature of the furnace (that is, the inner temperature of the reaction tube 11) from the target temperature T1 to the relatively low temperature T0 again after the predetermined process is completed. By lowering the inner temperature of the furnace from the target temperature T1 to the temperature T0 by the temperature control using the multi-cooling part of the embodiments described later, it is possible to reduce a temperature deviation between the zones.

The step S6 (boat unloading step) is a process of transferring (unloading) the processed wafer 1 out of the furnace together with the boat 31. As a result of unloading the processed wafer 1 supported by the boat 31 out of the furnace, the outer atmosphere of the furnace (room temperature) is introduced into the furnace. Therefore, the inner temperature of the furnace temporarily falls below the temperature T0. However, the inner temperature of the furnace is stabilized again at the temperature T0 after some time. The step S1 may be performed again when the next wafer 1 is processed. When the next wafer (unprocessed wafer) 1 is processed, it is preferable that the inner temperature of the furnace is stabilized again at the temperature T0 by the temperature control using the multi-cooling part of the embodiments described later.

That is, when there remains an unprocessed wafer 1 which should be processed, the processed wafer 1 on the boat 31 is replaced with the unprocessed substrate 1, and the series of processes of the steps S1 through S6 are performed (repeated).

Each of the steps S1 through S6 is performed only after its previous step continues to be in a stable state for a predetermined time in which the inner temperature of the furnace is within a predetermined minute temperature range close to the target temperature. Alternatively, in order to increase the number of the wafers processed for a predetermined time, the next step may be performed without reaching the stable state in its previous step which is the step S1, the step S2, the step S5 or the step S6.

Figure 5:
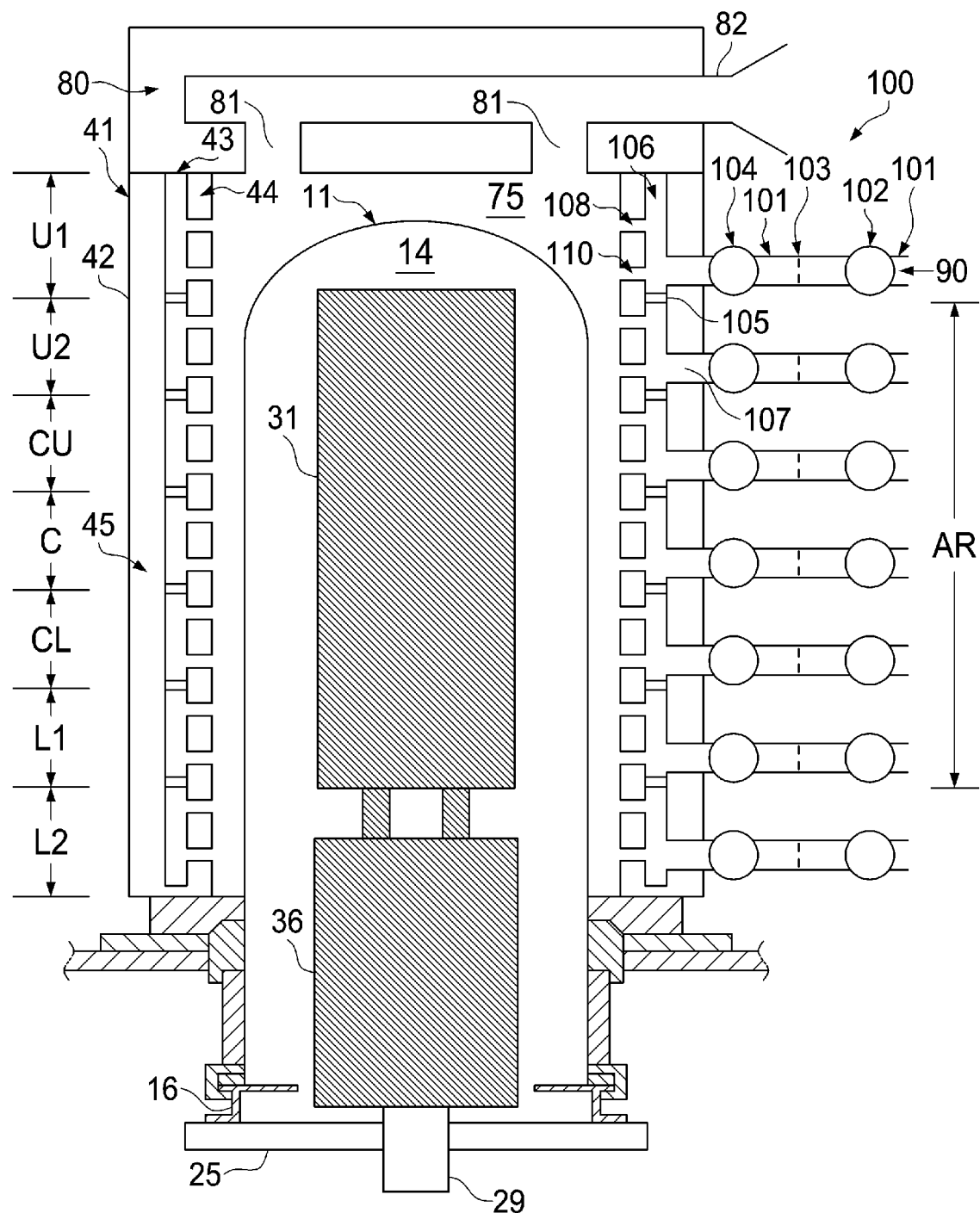
FIG. 5 schematically illustrates main parts of the substrate processing apparatus according to the embodiments described herein.

FIG. 5 schematically illustrates an example of the multi-cooling part of the embodiments. In FIG. 5, the outer tube 12 and the inner tube 13 are shown together in a simplified manner as the reaction tube 11, and the configuration of the heater 40 will be omitted.

As shown in FIG. 5, the multi-cooling part is constituted by a multi-cooling structure including: the plurality of the inlet pipes including the inlet pipe 101 configured to supply the cooling air 90 serving as a gas for cooling an inside of the furnace for each of a plurality of cooling zones (for example, zones corresponding to the zones U1, U2, CU, C, CL, L1 and L2); a plurality of control valves including a control valve 102 serving as a conductance valve provided in the inlet pipe 101 and configured to adjust a flow rate of the gas; the plurality of the opening holes (rapid cooling holes) including the opening hole 110 configured to eject the gas toward the reaction tube 11; and the plurality of the ring-shaped buffer parts including the ring-shaped buffer part 106 communicating with the opening hole 110 and configured to temporarily store the gas supplied through the inlet pipe 101. The opening hole 110 is configured to eject the cooling air 90 stored in the ring-shaped buffer part 106 into the internal space 75 through the gas supply flow path (also referred to as a "cooling gas passage") 108 provided in the sidewall inner layer 44. A cooling part 100 may be defined for each of the plurality of the cooling zones. For example, the cooling part 100 may include the inlet pipe 101, the control valve 102, the opening hole 110 and the ring-shaped buffer part 106. The multi-cooling structure according to the embodiments is constituted by a plurality of the cooling parts provided in the plurality of the cooling zones.

By setting (adjusting) the flow rate of the cooling air 90 introduced into the inlet pipe 101 provided in each of the cooling zones according to a relative zone length of each of the cooling zones and by opening/closing the control valve 102 provided in each of the cooling zones, it is possible to adjust a flow rate and a flow velocity of the cooling air 90 ejected from the opening hole 110 provided in each of the cooling zones toward the reaction tube 11. In addition, it is possible to change (adjust) the flow rate and the flow velocity of the cooling air 90 introduced into each of the cooling zones by a temperature controller (not shown) adjusting an opening degree of a valve body of the control valve 102 provided in each of the cooling zones according to component materials in the reaction tube 11.

The check damper 104 serving as the back-diffusion prevention part is provided at the inlet pipe 101 in order to prevent the reverse diffusion of the atmosphere of the internal space 75 from the process chamber 14. Since the atmosphere of the internal space 75 is exhausted through the exhaust hole 81 to an upper side of the internal space 75, the check damper 104 is configured to communicate with a lower side of the ring-shaped buffer part 106 provided in each of the cooling zones so that the cooling air 90 is efficiently stored in the ring-shaped buffer part 106. When the rapid cooling is not used, convection between the inlet pipe 101 and the heat insulating structure 42 is prevented.

The inlet pipe 101 is configured to be provided with a throttle portion 103 serving as an orifice for suppressing the flow rate of the cooling air 90 ejected through the opening hole 110. The throttle portion 103 may be provided for each of the zones as necessary.

Cross sectional areas of flow paths of the inlet pipes including the inlet pipe 101 provided in each of the zones and cross sectional areas of flow paths of the ring-shaped buffer parts including the ring-shaped buffer part 106 provided in each of the zones are set greater than the total of cross sectional areas of the opening holes including the opening hole 110 provided in each of the zones. In addition, the opening holes including the opening hole 110 are provided such that the flow rates and the flow velocities of the cooling air 90 ejected through the opening holes are invariant between the zones from an uppermost portion of a region AR to a lowermost zone of the region AR (for example, zones U2, CU, C, CL and L1 in FIG. 5). Product wafers supported by the boat 31 are located in the region AR, and, for example, an uppermost portion of the zone U2 is substantially at the same height of the uppermost portion of the region AR. Specifically, the opening holes including the opening hole 110 are provided in the zones at equal intervals in the circumferential direction and the vertical direction, and the cooling air 90 stored in the ring-shaped buffer part 106 is ejected into the internal space 75 through the gas supply flow path 108 provided in sidewall inner layer 44.

The heat insulating structure 42 used in the heater (heating device) 40 having the plurality of the control zones (in the embodiments, zones U1, U2, CU, C, CL, L1 and L2) includes: the side wall portion 43 formed in a cylindrical shape and having a multilayer structure; the plurality of the boundary parts including the boundary part 105 and configured to divide the sidewall portion 43 into the plurality of the cooling zones (for example, U1, U2, CU, C, CL, L1 and L2) in the vertical direction; the plurality of the ring-shaped buffer parts including the ring-shaped buffer part 106, each of which is provided between two vertically adjacent boundary parts 105 to form a space between the sidewall outer layer 45 and the sidewall inner layer 44; the plurality of the gas introduction paths including the gas introduction path 107, each of which communicates with the ring-shaped buffer part 106 and is provided on the sidewall outer layer 45 of the side wall portion 43 in each of the cooling zones; the plurality of the gas supply flow paths including the gas supply flow path 108, each of which is provided on the sidewall inner layer 44 of the side wall portion 43 in each of the cooling zones; the internal space 75 provided inside the sidewall inner layer 44; and the plurality of the opening holes including the opening hole 110, provided on the sidewall inner layer 44 at equal intervals both in the circumferential and vertical directions, and configured to eject the cooling air 90 into the internal space 75 through the plurality of the gas supply flow paths respectively for the plurality of the cooling zones.

The gas introduction path 107 is configured to communicate with the lower side of the ring-shaped buffer part 106. The opening hole 110 is provided where it does not face the gas introduction path 107. It goes without saying that the opening hole 110 is located such that the cooling air 90 ejected through the opening hole 110 is not directly disturbed by the heating element 56.

According to the embodiments, the plurality of the boundary parts including the boundary part 105 is arranged such that the number of the control zones is equal to the number of the cooling zones. However, the embodiments are not limited thereto. For example, the number of the control zones and the number of the cooling zones may be set arbitrarily.

As shown in FIG. 5, in the structure in the reaction tube 11 facing the zone U1 and the zone L2, the zone U1 is a space (ceiling space) and is a heat insulating region including the heat insulating cap portion 36. Since the zone U1 is different from the region AR, in practice, the cooling of the reaction tube 11 facing the zone U1 and the zone L2 may not be uniform. However, in the reaction tube 11 corresponding to a boundary between the zone U1 and the zone U2 and a boundary between the zone L1 and the zone L2, dummy wafers called "side dummy wafers" used for the temperature control may be placed on the boat 31. Therefore, it is possible to reduce the influence of the non-uniform cooling of the reaction tube 11 on the temperature of the wafer 1 serving as a product wafer.

Figure 6:
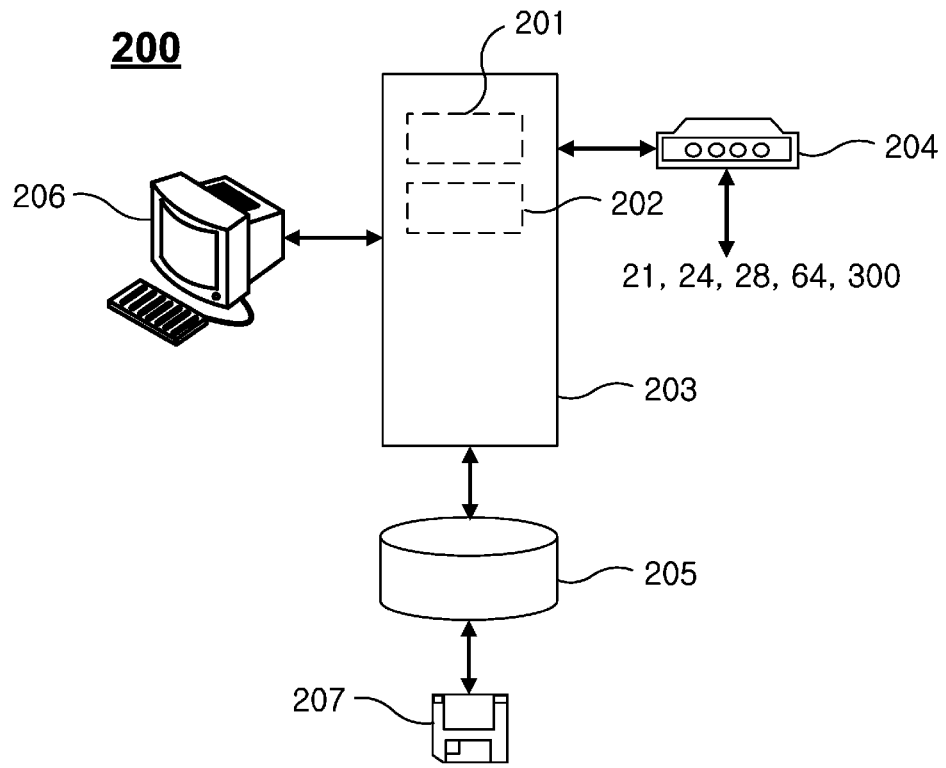
FIG. 6 schematically illustrates a hardware configuration of a controller of the substrate processing apparatus according to the embodiments described herein.

As shown in FIG. 6, a main controller 200, which is a control computer serving as a control mechanism, includes a computer main body 203 including components such as a CPU (Central Processing Unit) 201 and a memory 202; a communication IF (interface) 204 serving as a communication mechanism; a memory device 205 serving as a memory mechanism; and a display/input device 206 serving as an operation mechanism. That is, the main controller 200 includes components constituting a general-purpose computer.

The CPU 201 constitutes a backbone of the main controller 200. The CPU 201 is configured to execute a control program stored in the memory device 205 and a recipe stored in the memory device 205 (for example, a process recipe) according to an instruction from the display/input device 206.

As a recording medium 207 for storing data such as an operation program of the CPU 201, components such as a ROM (Read Only Memory), an EEPROM (Electrically Erasable Programmable Read Only Memory), a flash memory and a hard disk may be used. In the present specification, a RAM (Random Access Memory) functions as a component such as a work area of the CPU 201.

The communication interface 204 is electrically connected to the pressure controller 21, the gas flow controller 24, the operation controller 28 and the temperature controller 64. The pressure controller 21, the gas flow controller 24, the operation controller 28 and the temperature controller 64 may be collectively referred to simply as a sub-controller. The communication interface 204 can exchange data on the operation of components with the sub-controller. The communication interface 204 may be electrically connected to a valve controller 300 described later, and may exchange data for controlling the multi-cooling part.

While the embodiments will be described by way of an example in which the main controller 200 is embodied by a dedicated computer system, the main controller 200 is not limited to the dedicated computer system. For example, the main controller 200 may be embodied by a general computer system. For example, the main controller 200 may be embodied by installing in a general computer a program for executing the above-described process from the recording medium 207 such as a CD-ROM and a USB which stores the program. For example, the program may be provided through the communication interface 204 such as a communication line, a communication network and a communication system. Furthermore, the program posted on a bulletin board on the communication network may be received via the network. The program provided as described above may be executed to perform the above-described process under an OS (operating system) just like any other application programs.

Figure 7:
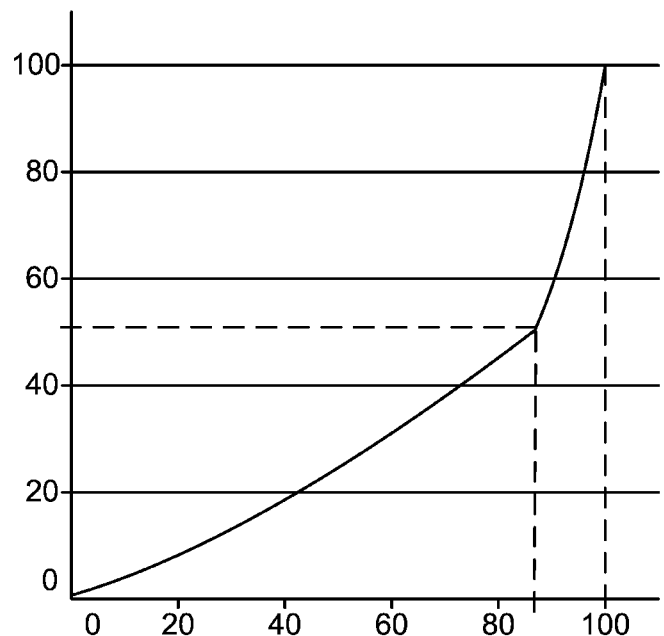
FIG. 7 schematically illustrates a relationship between a control valve and a cooling capacity of a cooling part of the substrate processing apparatus according to the embodiments described herein.

The cooling part 100 according to the embodiments has a configuration in which the control valve 102 is provided particularly in each of the cooling zones. As a result, it is possible to reduce differences between apparatuses during, e.g., the rapid cooling, wherein the differences are caused by a change in the exhaust facilities of a customer's factory, variations of individual components and installation conditions of the apparatuses. In addition, it is possible to adjust the cooling capacity by adjusting parameters such as the flow rate of the cooling air 90 supplied according to the opening degree of the control valve 102. For example, as shown in FIG. 7, a relationship between the opening degree of the control valve 102 and the cooling capacity is obtained in advance. Referring to FIG. 7, for example, the cooling capacity is 87% when the opening degree is 50%. The horizontal axis of the graph shown in FIG. 7 represents the cooling capacity (unit: %), and the vertical axis of the graph shown in FIG. 7 represents the opening degree (unit: %) of the control valve 102.

In the temperature lowering step S5, the opening degree of the control valve 102 is often adjusted to 100% (that is, the cooling capacity is 100%). However, for example, when the temperature is lowered according to the rate set in the temperature lowering step S5, or when the overshoot which occurs between the temperature elevating step S3 and the processing step (also referred to as a "film-forming step") S4 in FIG. 3 is stabilized, the control of the cooling capacity by adjusting the opening degree of the control valve 102 is required in addition to the conventional temperature control.

Hereinafter, the temperature control using the cooling part 100 of the embodiments will be described. That is, the temperature control and the opening degree control of the control valve 102 according to the embodiments will be described. Hereinafter, a first control method using the cooling part 100 of the embodiments is also referred to as "a first embodiment".

First Embodiment

A correlation of an exhaust air volume introduced into each of the zones and a temperature lowering rate is measured in advance, and the air volume of the introduced cooling air 90 is set according to the correlation. By fixing the opening degree of the control valve 102, it is possible to supply a constant flow rate in advance for each of the zones, and to obtain a predetermined target temperature lowering rate. Although the temperature lowering rate can be obtained by an inexpensive and simple method, it is greatly affected by the configuration and environment of the apparatus (for example, the differences between the apparatuses caused by a change in the exhaust facilities of a customer's factory, variations of individual components and the installation conditions of the apparatuses). Therefore, a reliability of the apparatus may be lowered.

The method of fixing the exhaust air volume of the cooling air 90 according to the first embodiment is embodied by actually measuring the correlation between the exhaust air volume and the temperature lowering rate. Therefore, although the method is stable, it takes time and effort. As a result, a start-up of the substrate processing apparatus 10 is likely to be significantly delayed.

Second Embodiment

Figure 8A:
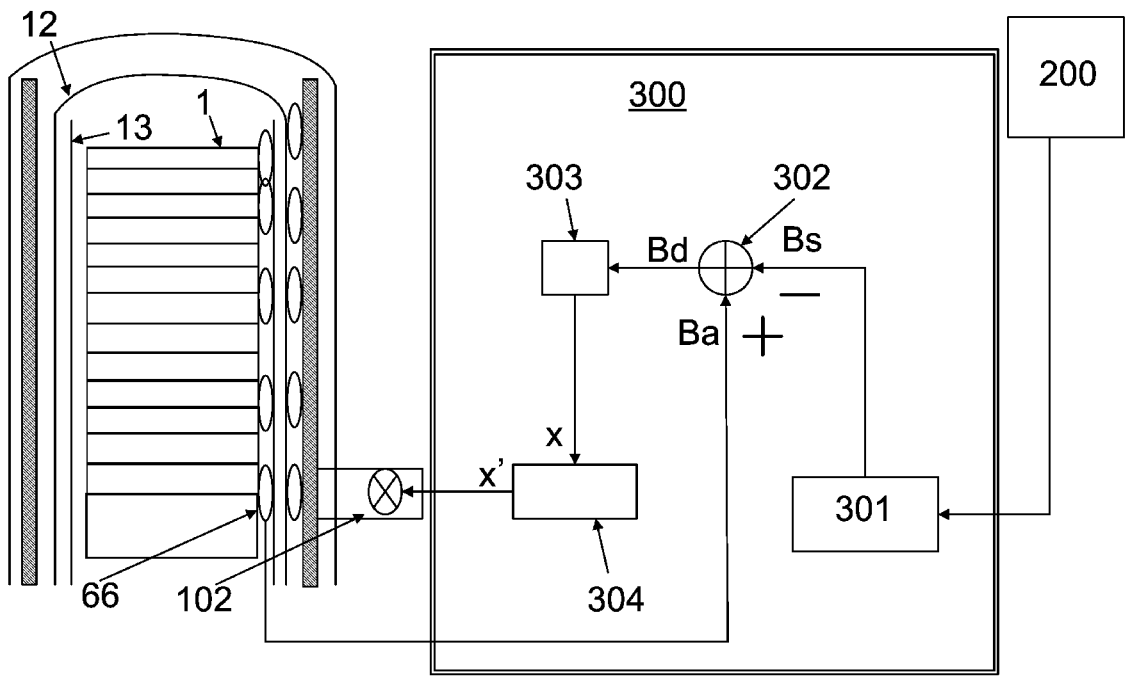
FIG. 8A schematically illustrates a relationship between a valve controller and the control valve of the substrate processing apparatus according to a second embodiment described herein.
Figure 8B:
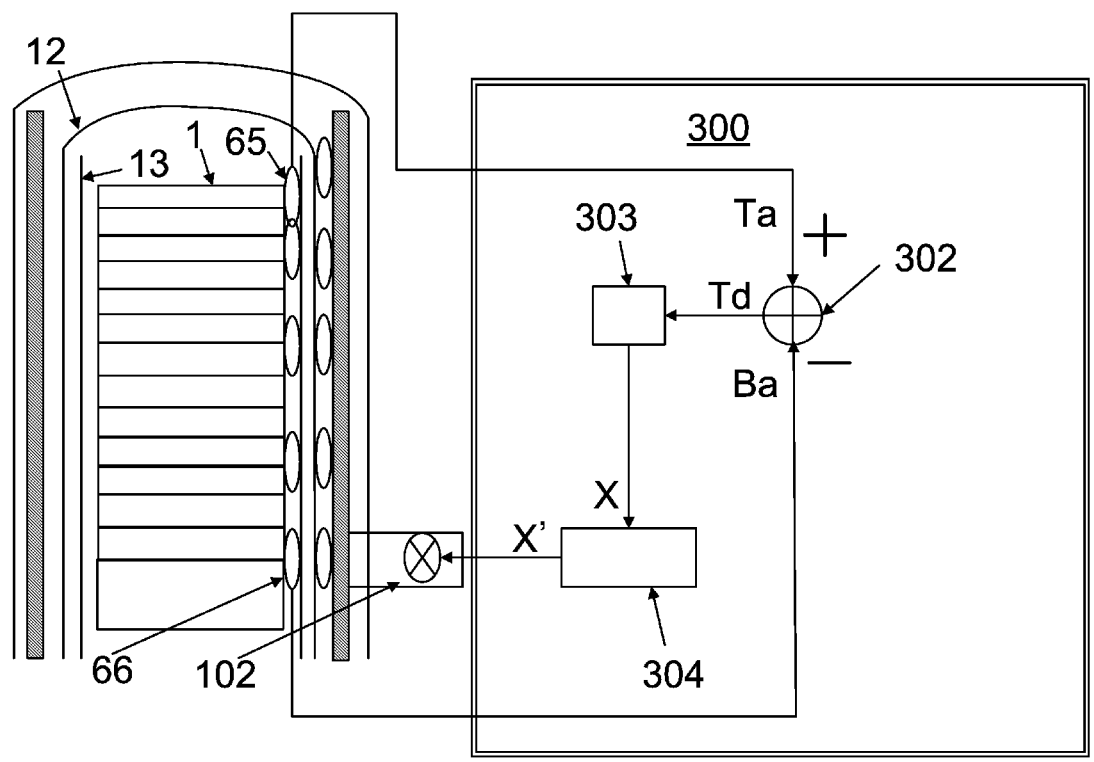
FIG. 8B schematically illustrates another relationship between the valve controller and the control valve of the substrate processing apparatus according to the second embodiment described herein.

Although only one of the control valves 102 is shown in FIGS. 8A and 8B for the convenience of explanation, the control valves 102 substantially identical thereto are provided at the other zones, and it is possible to adjust the opening degrees of the control valves differently for each of the zones. The cooling gas introduced through the control valves is also supplied into each of the zones. In addition, the control (temperature control) according to the second embodiment is performed at the time of the temperature lowering step S5 shown in FIG. 3.

The heater power of the heater 40 according to the second embodiment is always set to 0% in the temperature lowering step S5. Therefore, the description of calculating the heater power will be omitted. In the second embodiment, a control for calculating the opening degree of the control valve 102 will be described. The control for calculating the opening degree of the control valve 102 in the second embodiment is different between a reference zone and zones other than the reference zone.

First, the control of the control valve 102 of the reference zone will be described with reference to FIG. 8A. A reference setting value calculator 301 shown in FIG. 8A calculates a reference setting value from a previous setting value set by the main controller 200, a current setting value and a reference ramp rate. An equation for calculating the reference setting value is as follows.

(i) Ramping temperature deviation=(current setting value)−(previous setting value)
(ii) Ramping time=(ramping temperature deviation)/(reference ramp rate)
(iii) Reference setting value=(previous setting value)+(ramping temperature deviation)×[1−exp{(elapsed time)/(ramping time/time constant)}]

Referring to FIG. 8A, a subtractor 302 calculates a deviation Bd as a result of subtracting the reference setting value Bs obtained by the above equation from a temperature Ba of a thermocouple 66 of the reference zone set in the reference zone, and outputs the deviation Bd to a PD (Proportional Derivative) calculator 303 for calculating parameters of the control valve 102.

Figure 9A:
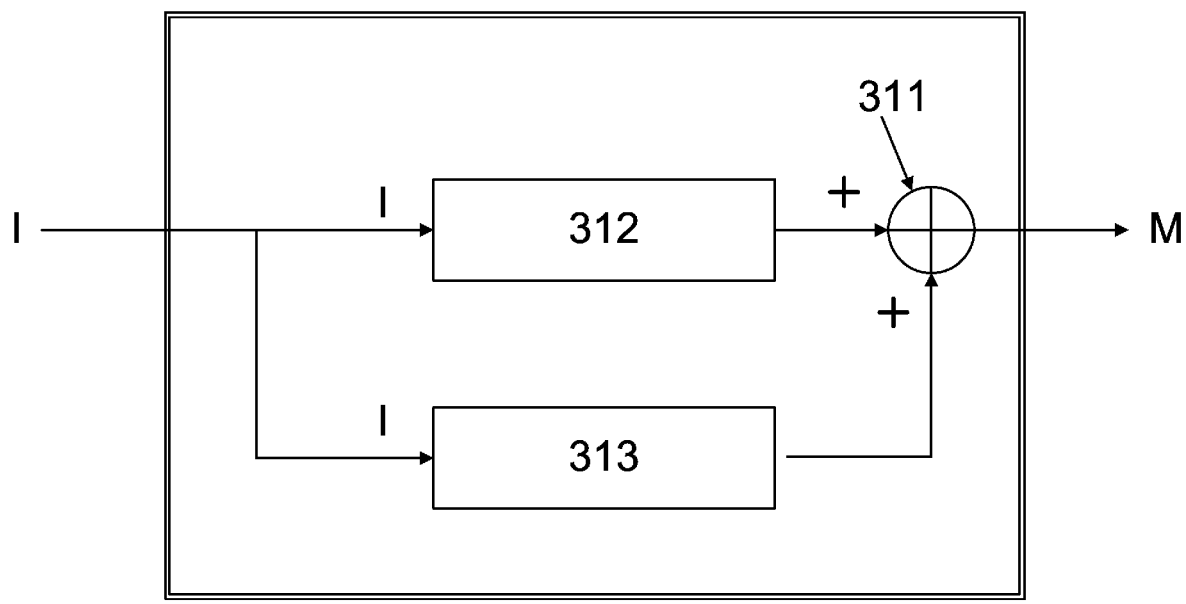
FIG. 9A schematically illustrates a PD (Proportional Derivative) calculator used in the valve controller of the substrate processing apparatus according to the embodiments described herein.

The PD calculator 303 will be described based on FIG. 9A. The PD calculator 303 is constituted by an adder 311, a proportional calculator 312 and a differential calculator 313. The proportional calculator 312 receives a deviation I, and outputs a value obtained by multiplying (that is, P operation) a preset parameter Kp as a proportional value O. When the deviation I at a specific time t is denoted by I(t) and the proportional value O at the specific time t is denoted by then the proportional value O can be obtained according to the following Equation 1.

$$O(t)=Kp \cdot I(t) \quad \text{[Equation 1]}$$

The differential calculator 313 receives the deviation I, and outputs a value obtained by multiplying the result of time differentiation (D operation) of the deviation I by a preset parameter Kd as a differential value R. When the deviation I at the specific time t is denoted by I(t) and the differential value R at the specific time t is denoted by R(t), then the differential value R can be obtained according to the following Equation 2.

$$R(t)=Kd \cdot dI(t)/dt \quad \text{[Equation 2]}$$

The adder 311 receives the proportional value O and the differential value R, and outputs an operation amount M by calculating the sum of the proportional value O and the differential value R. When the deviation I at the specific time t is denoted by I(t) and the operation amount M at the specific time t is denoted by M(t), then the operation amount M of the control valve 102 can be obtained according to the following Equation 3 from the Equation 1 and Equation 2 described above.

$$M(t)=Kp \cdot I(t)+Kd \cdot dI(t)/dt \quad \text{[Equation 3]}$$

The previous setting value, the current setting value and the reference ramp rate are input from the main controller 200 shown in FIG. 8A to the valve controller 300, and the reference setting value Bs is calculated by the reference setting value calculator 301. The temperature B a of the thermocouple 66 of the reference zone and the reference setting value Bs is input to the subtractor 302, and the subtractor 302 in the valve controller 300 outputs the deviation Bd obtained by subtracting the reference setting value Bs from the temperature Ba of the thermocouple 66 of the reference zone. Then, the PD calculator 303 determines an operation amount x by performing a PD operation using the deviation Bd. The operation amount x is converted into an opening degree x' by an opening degree converter 304, and the opening degree of the control valve 102 is changed. The temperature Ba read from the thermocouple 66 of the reference zone is returned (feedbacked) to the valve controller 300 again. As described above, the opening degree of the control valve 102 is changed continually so that the deviation Bd between the temperature Ba of the thermocouple 66 of the reference zone and the reference setting value B s becomes zero.

Hereinafter, the control valve 102 provided at a zone other than the reference zone will be described using FIG. 8B. As shown in FIG. 8B, the subtractor 302 calculates the result of subtracting the temperature Ba of the thermocouple 66 of the reference zone from a temperature Ta of the thermocouple 65 of the zone other than the reference zone as a deviation Td, and outputs the deviation Td to the PD calculator 303. The PD calculator 303 is already described above and the description thereof would be substantially the same, so the description thereof will be omitted.

As shown in FIG. 8B, first, the temperature Ba of the thermocouple 66 of the reference zone is input to the subtractor 302, and additionally, the temperature Ta of the thermocouple 65 of the zone other than the reference zone is input to the subtractor 302. The subtractor 302 in the valve controller 300 outputs the deviation Td obtained by subtracting the temperature Ba of the thermocouple 66 of the reference zone from the temperature Ta of the thermocouple 65 of the zone other than the reference zone. Then, the PD calculator 303 determines an operation amount X by performing a PD operation using the deviation Td. The operation amount X is converted into an opening degree X' by the opening degree converter 304, and the opening degree of the control valve 102 is changed. The temperature Ba read from the thermocouple 66 of the reference zone and the temperature Ta read from the thermocouple 65 of the zone other than the reference zone are returned (feedbacked) to the valve controller 300 again. As described above, the opening degree of the control valve 102 is changed continually so that the deviation Td between the temperature Ba of the thermocouple 66 of the reference zone and the temperature Ta of the thermocouple 65 of the zone other than the reference zone becomes zero.

According to the second embodiment described above, at least one or more of the following effects can be provided.

(a) By controlling the opening degree of the control valve 102 such that the temperature deviation between the temperature of the reference zone serving as a target temperature and the temperature of the zone other than the reference zone becomes zero, it is possible to reduce the deviation (for example, the temperature deviation) between the zones.

(b) By controlling the control valve 102 such that the deviation between the temperature of the reference zone and the reference setting value obtained from the setting values described above becomes zero, it is possible to improve the reproducibility of the temperature of the reference zone by using the constant reference setting value even when there occurs a temporal change or a difference between the apparatuses caused by, e.g., a change in the exhaust facilities of a customer's factory.

(c) It is also possible to control the control valve 102 such that the deviations of all of the zones from the reference setting value become zero. However, for example, the deviation between the zones becomes worse when a certain zone cannot conform to the reference setting value. Accordingly, by controlling only the reference zone to conform to the reference setting value as in the second embodiment, even if the temperature of the reference zone cannot follow the reference setting value, the deviation between the temperature of the reference zone and the temperature of the zone other than the reference zone may become zero. Therefore, it is possible to prevent the deviation between the zones from deteriorating.

Third Embodiment

Figure 10:
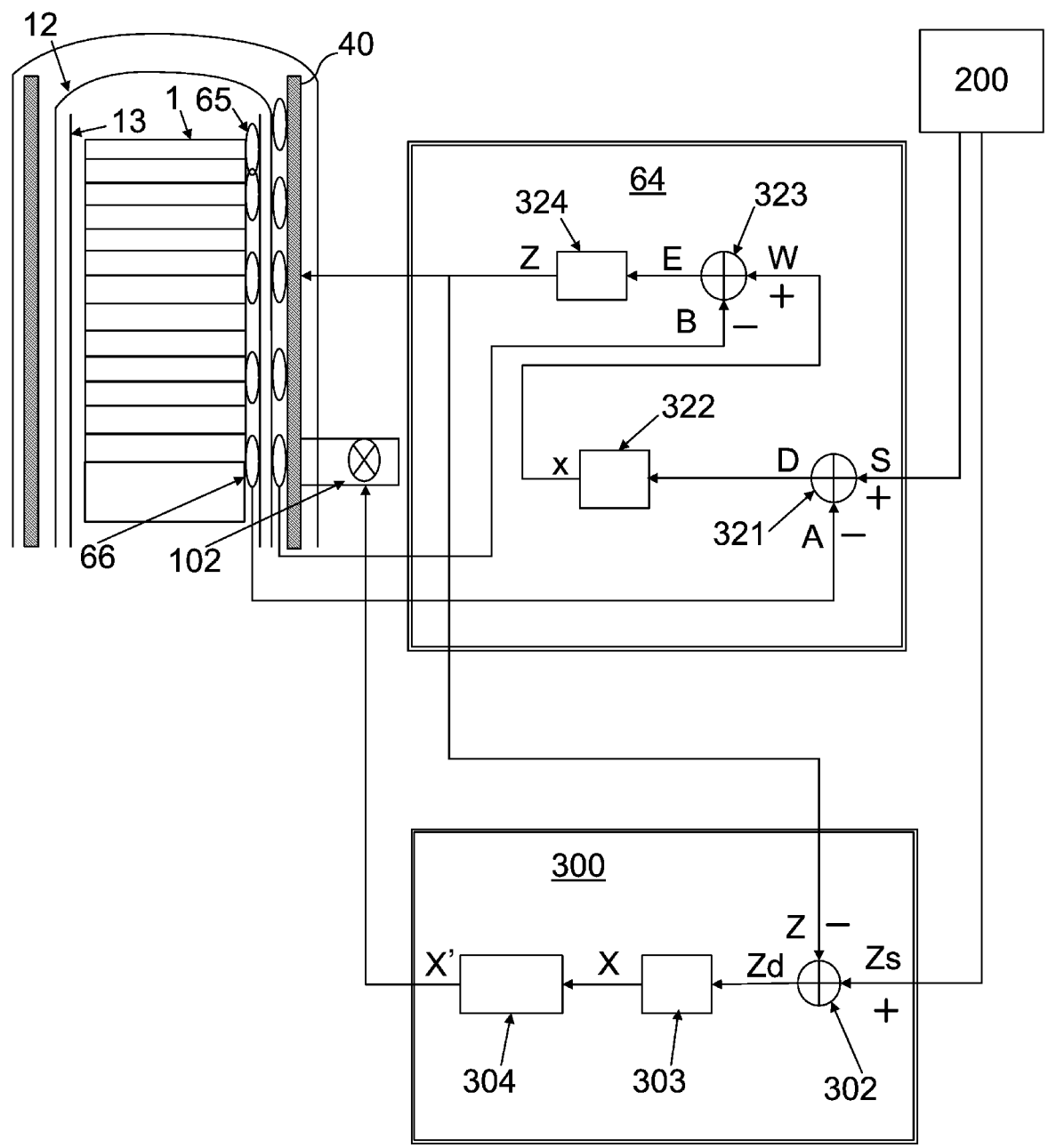
FIG. 10 schematically illustrates a relationship among the temperature controller, the valve controller and the control valve of the substrate processing apparatus according to a third embodiment described herein.

Although only one of the control valves 102 is shown only one in FIG. 10 for the convenience of explanation, the control valves 102 substantially identical thereto are provided at the other zones, and it is possible to adjust the opening degrees of the control valves differently for the respective zones. The cooling gas (cooling air 90) introduced through the control valves is also supplied into each of the zones.

The calculation of the heater power of the heater 40 is performed. That is, a subtractor 321 calculates the result of subtracting a control amount A from a setting value (also referred to as a "target value") S set by a host controller such as the main controller 200 as a deviation D, and outputs the deviation D to a PID (Proportional, Integral, Derivative) calculator 322.

Figure 9B:
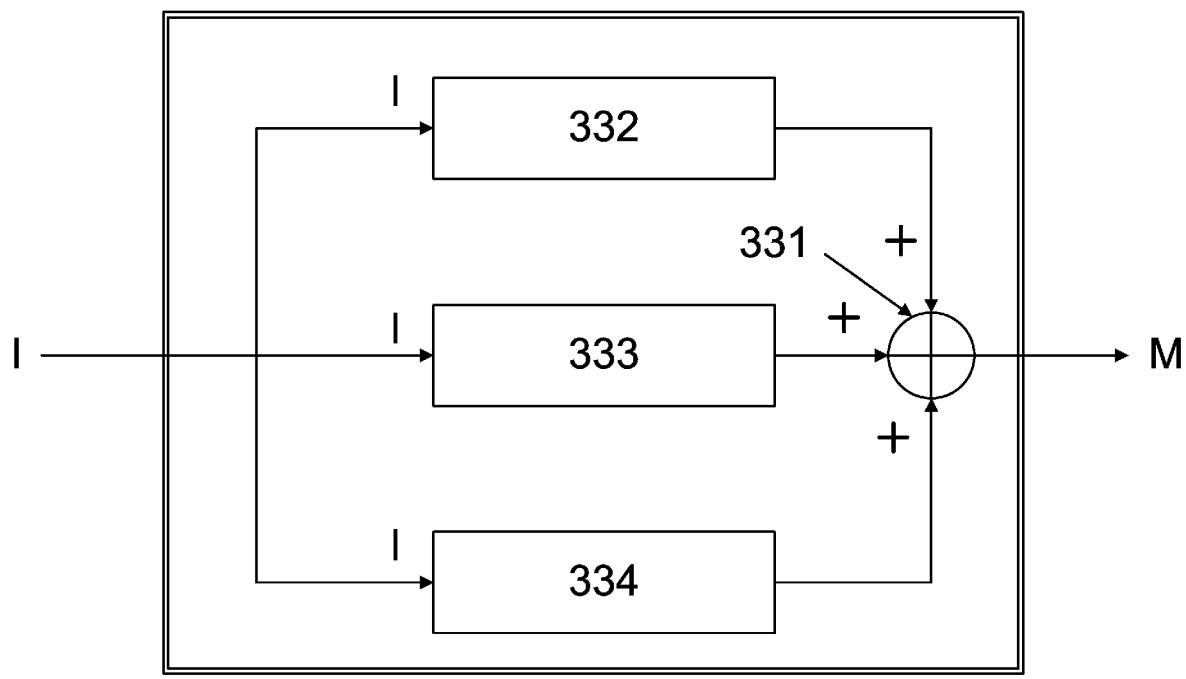
FIG. 9B schematically illustrates a PID (Proportional, Integral, Derivative) calculator used in a temperature controller of the substrate processing apparatus according to the embodiments described herein.

The PID calculator 322 will be described based on FIG. 9B. The PID calculator 322 is constituted by an adder 331, an integral calculator 332, a proportional calculator 333 and a differential calculator 334. The integral calculator 332 receives the deviation I, and outputs a value obtained by multiplying the result of time integral operation (I operation) of the deviation I by a preset parameter Ki as an integral value N. When the deviation I at the specific time t is denoted by I(t) and the integral value N at the specific time t is denoted by N(t), then the integral value N can be obtained according to the following Equation 4.

$$N(t)=Ki \cdot \int_0^t I(u)du \quad \text{[Equation 4]}$$

The proportional calculator 333 receives the deviation I, and outputs a value obtained by multiplying (that is, P operation) a preset parameter Kp as a proportional value O. When the deviation I at the specific time t is denoted by I(t) and the proportional value O at the specific time t is denoted by O(t), then the proportional value O can be obtained according to the following Equation 5.

$$O(t)=Kp \cdot I(t) \quad \text{[Equation 5]}$$

The differential calculator 334 receives the deviation I, and outputs a value obtained by multiplying the result of time differentiation (D operation) of the deviation I by a preset parameter Kd as a differential value R. When the deviation I at the specific time t is denoted by I(t) and the differential value R at the specific time t is denoted by R(t), then the differential value R can be obtained according to the following Equation 6.

$$R(t)=Kd \cdot dI(t)/dt \qquad \text{[Equation 6]}$$

The adder 331 receives the integral value N, the proportional value O and the differential value R, and outputs an operation amount M by calculating the sum of the integral value N, the proportional value O and the differential value R. When the deviation I at the specific time t is denoted by I(t) and the operation amount M at the specific time t is denoted by M(t), then the operation amount M can be obtained according to the following Equation 7, which is called a PID operation, from the Equation 4, Equation 5 and Equation 6 described above.

$$M(t)=Kp \cdot I(t)+Ki \cdot \int_0^t I(u)du+Kd \cdot dI(t)/dt \qquad \text{[Equation 7]}$$

As shown in FIG. 10, first, the target value (setting value) S is input from the main controller 200 to the temperature controller 64, and additionally, the control amount A from the thermocouple (cascade thermocouple) 65 is input to the subtractor 321. The subtractor 321 in the temperature controller 64 outputs the deviation D obtained by subtracting the control amount A from the target value S. Then, the PID calculator 322 determines an operation amount x by performing a PID operation using the deviation D. The operation amount x is converted into a target value W by a converter (not shown), and the target value W and a control amount B from the thermocouple of the heater 40 are input to a subtractor 323. The subtractor 323 in the temperature controller 64 outputs a deviation E obtained by subtracting the control amount B from the target value W. Then, a PID calculator 324 determines an operation amount Z by performing a PID operation using the deviation E. The operation amount Z serves as an output of the temperature controller 64, and is input to the heater 40. The control amount A and the control amount B output from the heater 40 are returned (feedbacked) to the temperature controller 64 again. As described above, the operation amount Z output from the temperature controller 64 is changed continually so that the deviation D between the target value S and the control amount A becomes zero. The control method described above is also referred to as a "PID control".

Hereinafter, a control for calculating the opening degree of the control valve 102 will be described. The subtractor 302 calculates a deviation Zd as a result of subtracting the operation amount Z obtained by the temperature controller 64 from a power setting value Zs set by the main controller 200, and outputs the deviation Zd to the PD calculator 303 for calculating parameters of the control valve 102.

As shown in FIG. 10, first, the power setting value (also referred to as a "power target value") Zs is input from the main controller 200 to the valve controller 300, and additionally, the operation amount (also referred to as a "heater power operation amount) Z is input to the subtractor 302. The subtractor 302 in the valve controller 300 outputs the deviation Zd obtained by subtracting the heater power operation amount Z from the power target value Zs. Then, the PD calculator 303 determines an operation amount X by performing a PD operation using the deviation Zd. The operation amount X is converted into an opening degree X' by the opening degree converter 304, and the opening degree of the control valve 102 is changed.

The heater power operation amount Z output from the heater 40 is returned (feedbacked) to the valve controller 300 again. As described above, the opening degree of the control valve 102 is changed continually so that the deviation Zd between the heater power operation amount Z output from the temperature controller 64 and the power target value Zs becomes zero.

According to the third embodiment described above, at least one or more of the following effects can be provided.
(d) By providing the conductance valve capable of adjusting the opening degree for differentiating between the cooling capacities of the respective zones and by changing the opening degree of the conductance valve according to the condition of the process chamber to change the cooling capacity for each of the zones, it is possible to improve the temperature deviation between the zones.
(e) By controlling the conductance valve, it is possible to absorb and reduce the differences between the apparatuses caused by a change in the exhaust facilities of a customer's factory, variations of the individual components and the installation conditions of the apparatuses.
(f) By changing the cooling capacity by controlling the opening degree of the conductance valve, it is possible to reduce the excessive output of the heater power resulting from the differences in the temperature lowering rate between the zones due to the structure in the reaction tube during the rapid cooling by the cooling air, and it is also possible to save energy efficiently.
(g) By supplying the cooling air to each of the zones when the temperature recovery is performed to stabilize the temperature, it is possible to quickly eliminate the temperature overshoot due to excess heat.
(h) By shortening the time for stabilizing the temperature during the temperature recovery, it is possible to improve the temperature stability.

Fourth Embodiment

The calculation of the heater power of the heater 40 is performed in a manner similar to the method described above. That is, the subtractor 302 calculates the result of subtracting a deviation target value Ds set by the main controller 200 from the deviation D calculated by the temperature controller 64 described above as a deviation Dd, and outputs the deviation Dd to the PD calculator 303. Since the operation of the PD calculator 303 has already been described above, the detailed description of the PD calculator 303 will be omitted.

Figure 11:
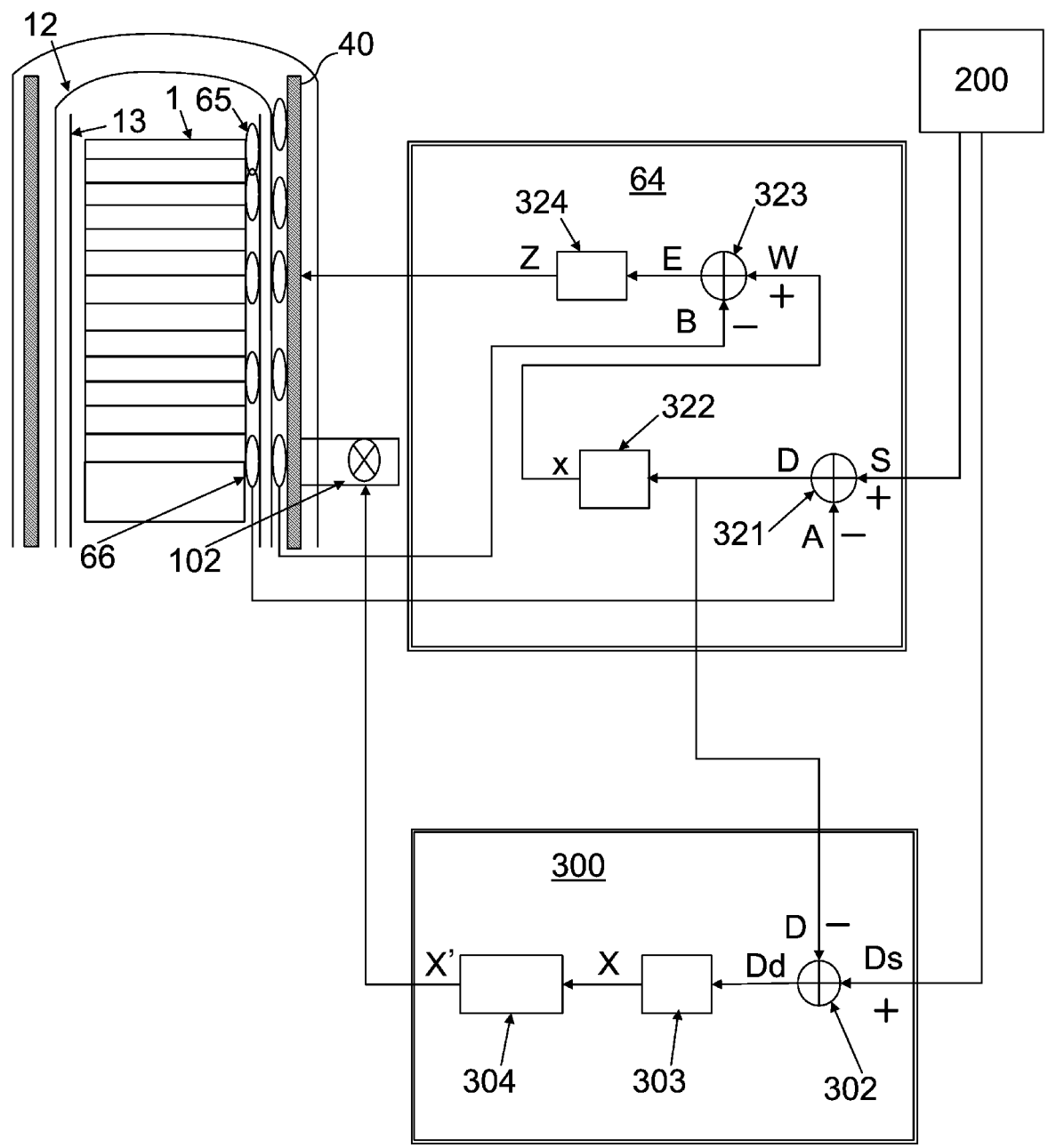
FIG. 11 schematically illustrates a relationship among the temperature controller, the valve controller and the control valve of the substrate processing apparatus according to a fourth embodiment described herein.

As shown in FIG. 11, first, the deviation target value Ds is input from the main controller 200 to the valve controller 300, and additionally, the deviation D is input to the subtractor 302. The subtractor 302 in the valve controller 300 outputs the deviation Dd obtained by subtracting the deviation target value Ds from the deviation D. Then, the PD calculator 303 determines an operation amount X by performing a PD operation using the deviation Dd. The operation amount X is converted into an opening degree X' by the opening degree converter 304, and the opening degree of the control valve 102 is changed.

The deviation D calculated by the temperature controller 64 is returned (feedbacked) to the valve controller 300 again. As described above, the opening degree of the control valve 102 is changed continually so that the deviation Dd between the deviation D calculated by the temperature controller 64 and the deviation target value Ds becomes zero.

The fourth embodiment performs substantially the same control as that of the third embodiment, so the same effects as the third embodiment (that is, at least one or more of the effects (d) through (h) described above) can be provided according to the fourth embodiment. However, according to the fourth embodiment, the cooling by opening the control valve 102 is not performed unless the deviation D (for example, the overshoot) occurs. Therefore, the third embodiment is preferable in which the opening degree of the control valve 102 is adjusted by using the operation amount Z as a trigger.

Hereinafter, examples in which the first through fourth embodiments are applied to the flowchart shown in FIG. 3 will be described below.

First Example

In the first example, the third embodiment is used in the temperature elevating step S3 and the temperature lowering step S5. However, in the first example, the fourth embodiment may be used in at least one of the temperature elevating step S3 and the temperature lowering step S5 instead of the third embodiment.

In the temperature elevating step S3, the temperature controller 64 is configured to control the operation amount Z so that the thermocouple 65 reaches the target temperature T1 by the PID control. The valve controller 300 performs a PD control so that the deviation Zd between the operation amount Z and the power setting value Zs from the main controller 200 becomes zero. Thereby, it is possible to adjust the opening degree of the control valve 102 and to control the cooling capacity. In the first example, when the I operation (integral operation) is eliminated, a normal offset is generated, and as a result, the deviation from the setting value may not become zero while remaining constant. On the other hand, when the I operation is performed, the delay time may occur while the operation amount coincides with the setting value. According to the embodiments, (that is, the third embodiment and the fourth embodiment), since the power value (operation amount Z) is controlled by the PID operation including the I operation by the heater control by the heater 40, the I operation for controlling the cooling part 100 may be omitted.

In the temperature elevating step S3, when the power value is less than the power setting value (target power value), the temperature elevating capacity (power value) is greater than the cooling capacity (the opening degree of the control valve 102), and the valve controller 300 determines that the cooling capacity is insufficient. Thus, the valve controller 300 is configured to control the control valve 102 to increase the opening degree of the control valve 102 in order to enhance the cooling capacity and to increase the power output. Conversely, when the power value is equal to or greater than the target power value, the temperature elevating capacity (power value) is lower than the cooling capacity (the opening degree of the control valve 102), and the valve controller 300 determines that the cooling capacity is excessive. Thus, the valve controller 300 is configured to control the control valve 102 to decrease the opening degree of the control valve 102 to reduce the cooling capacity and to decrease the power output.

Recently, there are increasing demands for enhancing the temperature elevating rate as much as possible in order to improve the productivity. By simply increasing the power of the heater 40, it is possible to increase the temperature elevating rate. However, when the temperature elevating rate is increased, the overshoot amplitude is also increased.

In the conventional control performed only by the heater 40, it takes time to converge the target temperature. Therefore, when the temperature converges to the target temperature to some extent, the next step may be performed.

According to the first example, the cooling by the cooling part is also performed during the temperature elevating even when the temperature elevating rate is great. For example, when the temperature deviates upward from the temperature elevating rate, the power value (operation amount Z) is decreased and the power value falls below the target power value. Therefore, the valve controller 300 increases the opening degree of the control valve 102 to strengthen the cooling capacity. Conversely, when the temperature deviates downward from the temperature elevating rate, the operation amount Z is increased and the power value becomes equal to or higher than the target power value. Therefore, the valve controller 300 decreases the opening degree of the control valve 102 to weaken the cooling capacity. As described above, since the heating by the heater 40 and the cooling by the cooling part are performed in parallel to keep the temperature elevating rate, it is possible to suppress the overshoot even when the temperature elevating rate is great. Therefore, it is possible to improve a temperature recovery time and the temperature stability at the time of the transition from the temperature elevating step S3 to the film-forming step S4.

When the overshoot occurs at the transition between the temperature elevating step S3 and the film-forming step S4, the power value (operation amount Z) is decreased and the power value becomes equal to or less than the target power value. Therefore, the valve controller 300 increases the opening degree of the control valve 102 to strengthen the cooling capacity. As a result, it is possible to make the temperature closer to the target temperature T1 as compared with the conventional heater control. Conversely, when the temperature becomes lower than the target temperature T1, the power value (operation amount Z) is increased. Therefore, the valve controller 300 decreases the opening degree of the control valve 102. As a result, it is possible to make the temperature to be close to the target temperature T1. By repeating the operation described above, it is possible to converge the temperature to the target temperature.

By using the control of the valve controller 300 (assisted by the cooling part 100), it is possible to decrease the temperature recovery time. In addition, compared with the control performed only by the temperature control of the heater 40 so far, it is possible to remarkably improve the temperature stabilization at the time of the transition from the temperature elevating step S3 to the film-forming step S4.

Then, after the predetermined process is performed to the wafer 1, the temperature is lowered to the target temperature T0 in the temperature lowering step S5.

In the temperature lowering step S5, as in the temperature elevating step S3, the temperature controller 64 is configured to control the operation amount Z so that the thermocouple 65 reaches the target temperature T0 by the PID control. The valve controller 300 performs a PD control so that the deviation Zd between the operation amount Z and the power setting value Zs from the main controller 200 becomes zero. Thereby, it is possible to adjust the opening degree of the control valve 102 and to control the cooling capacity.

In the temperature lowering step S5, the operation amount Z is set small to decrease the temperature from the temperature T1 to the temperature T0. Thus, the valve controller 300 increases the opening degree of the control valve 102 to strengthen the cooling capacity. However, when the cooling capacity is increased excessively and the temperature falls down below a temperature expected based on the temperature lowering rate, the operation amount Z is set great. Then, the valve controller 300 decreases the opening degree of the control valve 102 to weaken the cooling capacity. Thus, by repeating the heating by the heater 40 and the cooling by the valve controller 300, it is possible to keep the temperature lowering rate set in advance. As described above, compared with the control performed only by the temperature control of the heater 40 so far, by using the control of the valve controller 300 (assisted by the cooling part 100), it is possible to remarkably improve the temperature deviation between the zones and to save the energy efficiently during the temperature lowering step.

Even when the fourth embodiment is used instead of the third embodiment in the first example, only the power value (operation amount Z) is changed to the deviation Dd and the others are the same. Therefore, the detailed description thereof will be omitted.

Second Example

In the second example, the third embodiment is used in the temperature elevating step S3, and the second embodiment is used in the temperature lowering step S5. However, in the second example, the fourth embodiment may be used in the temperature elevating step S3 instead of the third embodiment and the first embodiment may be used in the temperature lowering step S5 instead of the second embodiment. That is, in the examples, it is possible to combine the first embodiment through the fourth embodiment as desired.

The temperature elevating step S3 is the same as that of the first example. Therefore, the detailed description thereof will be omitted. Then, after the predetermined process is performed to the wafer 1 in the step S4, the temperature is lowered from the temperature T1 to the target temperature T0 in the temperature lowering step S5. In the second example, by setting the power of the heater 40 in the temperature lowering step S5 to 0% always and by lowering the temperature rapidly, it is possible to improve the throughput (productivity).

In the temperature lowering step S5, the opening degree of the control valve 102 is controlled based on the actually measured temperature Ba of the reference zone set in advance. Specifically, regarding the reference zone, the previous setting value (for example, the temperature T1), the current setting value (for example, the temperature T0) and the reference ramp rate is input from the main controller 200 to the valve controller 300, and the reference setting value Bs is calculated by the reference setting value calculator 301. The temperature Ba of the thermocouple of the reference zone is input to the subtractor 302, and the subtractor 302 in the valve controller 300 outputs the deviation Bd obtained by subtracting the reference setting value Bs from the temperature Ba of the thermocouple of the reference zone. Then, the PD calculator 303 determines an operation amount X by performing a PD operation using the deviation Bd. The operation amount X is converted into an opening degree X', and the opening degree of the control valve 102 is adjusted.

Regarding the zones other than the reference zone, the temperature Ba of the thermocouple of the reference zone is input to the subtractor 302, and additionally, the temperature Ta of the thermocouple of the zone other than the reference zone is input to the subtractor 302. The subtractor 302 in the valve controller 300 outputs the deviation Td obtained by subtracting the temperature Ba of the thermocouple of the reference zone from the temperature Ta of the thermocouple of the zone other than the reference zone. Then, the PD calculator 303 determines an operation amount X by performing a PD operation using the deviation Td. The operation amount X is converted into an opening degree X', and the opening degree of the control valve 102 is adjusted.

As described above, by controlling only the temperature of the reference zone to conform to the reference setting value, even if the temperature of the reference zone cannot conform to the reference setting value, it is possible to control the temperature of the zones other than the reference zone equal to the temperature of the reference zone (that is, the deviation between the temperature of the zones other than the reference zone and the temperature of the reference zone is 0). Therefore, it is possible to prevent the deviation between the zones from deteriorating.

Hereinafter, results of the verification of the examples described above will be described with reference to FIGS. 12 through 15. Hereinafter, the temperature deviation indicates the difference between the maximum value and the minimum value of the temperatures measured in the plurality of the control zones (that is, the temperature deviation is obtained by subtracting the minimum value from the maximum value).

Figure 12:
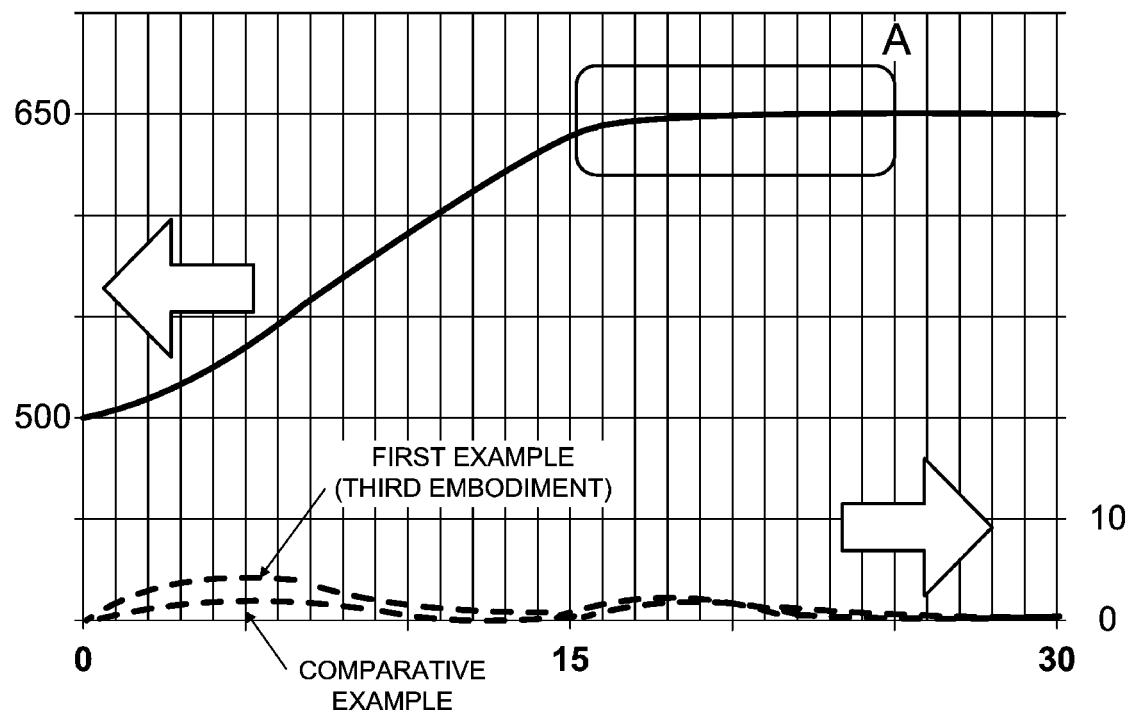
FIG. 12 schematically illustrates the temperature characteristics of a first example when the third embodiment is applied to a step S3 shown in FIG. 3.
Figure 13:
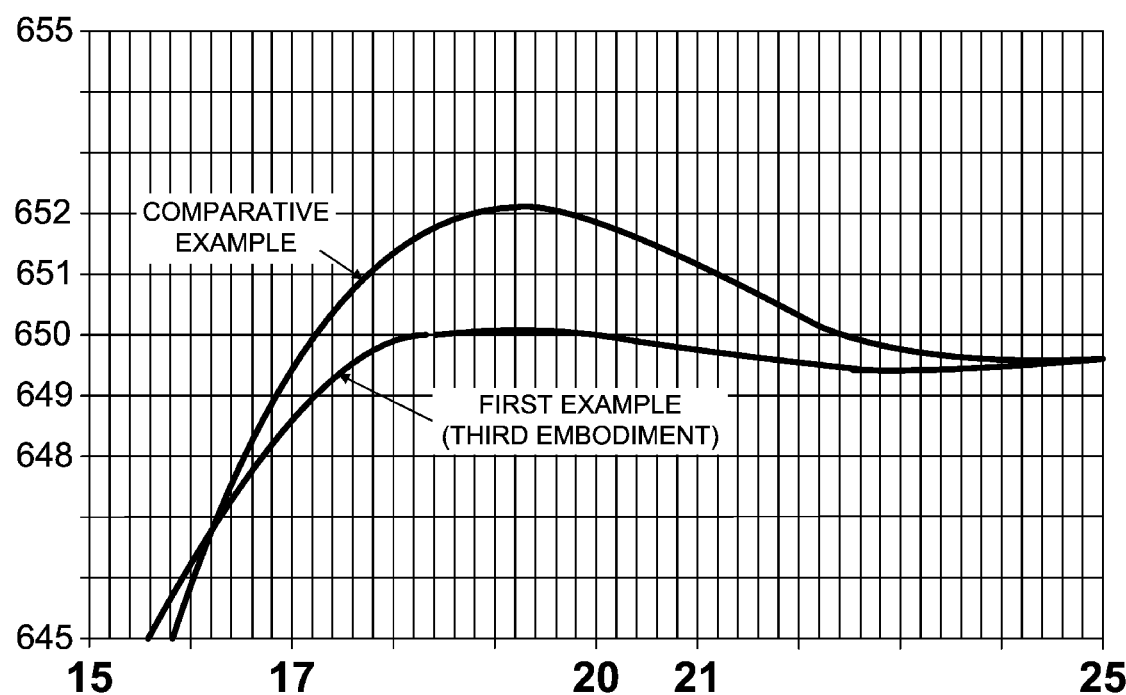
FIG. 13 is an enlarged view of a portion "A" shown in FIG. 12.

FIGS. 12 and 13 schematically illustrate the temperature characteristics of the first example when the temperature control using the cooling part in the third embodiment described above is applied to the temperature elevating step S3. In FIGS. 12 and 13, the change in the inner temperature of the furnace in the temperature elevating step S3 according to the third embodiment described above is compared with that of a comparative example (without the cooling part).

In FIG. 12, the temperature change from the start of the temperature elevating step S3 to the processing step S4 is exemplified by the temperature of the zone CU among the plurality of the control zones. The horizontal axis of the graph shown in FIG. 12 represents the time (unit: minute), and the vertical axis of the graph shown in FIG. 12 represent the temperature (unit: ° C.). In particular, the vertical axis of the graph shown in FIG. 12 represents both of the inner temperature of the furnace and the temperature deviation. The start time of the temperature elevating step S3 is represented by 0 minute in FIG. 12. In addition, in FIG. 12, the change of the inner temperature of the furnace when the temperature is elevated from 500° C. (standby temperature T0) to 650° C. (target temperature T1) at a temperature elevating rate of 10° C./minute is indicated by a solid line, and the temperature deviation between the zones from the temperature elevating step S3 to the processing step S4 is indicated by a dotted line.

According to the temperature characteristics of the first example shown in FIG. 12, the temperature control using the cooling part 100 according to the third embodiment is performed for 15 minutes (that is, the time obtained by "(650−500)/10") from the start of the temperature elevating step S3. However, the difference from the normal temperature control without using the cooling part 100 (that is, the temperature control according to the comparative example in FIG. 12) is not clearly shown. In particular, the change of the inner temperature of the furnace cannot be distinguished because the comparative example and the first example almost entirely overlap.

FIG. 13 is an enlarged view of a portion where the process is shifted from the temperature elevating step S3 to the processing step S4 (that is, a portion "A" shown in FIG. 12). In FIG. 13, the change of the inner temperature of the furnace after 15 minutes from the start of the temperature elevating step S3 is shown. The time of 15 minutes corresponds to the time during the temperature control is performed by using both of the heating by the heater 40 and the cooling by the cooling part 100.

According to the graph shown in FIG. 13, in the comparative example, the overshoot is 2° C. and the time for which the temperature is stabilized within upper and lower limit values of 1° C. is approximately 21 minutes from the start of the temperature elevating step S3. In the temperature control using the cooling part 100 according to the first example (the third embodiment), the overshoot is 0.5° C. and the time for which the temperature is stabilized within upper and lower limit values of 1° C. is approximately 17 minutes from the start of the temperature elevating step S3. Thus, the temperature stability of the first example is significantly improved as compared with that of the comparative example.

The time of 17 minutes indicates a time duration in which the inner temperature of the furnace (for example, the temperature of the zone CU) reaches 649° C. (that is, a temperature obtained by subtracting the lower limit value from the target temperature) when the temperature is elevated from 500° C. to 650° C. According to the first example (the third embodiment), after the temperature reaches 649° C., the temperature converges to the 650° C. within the range of the upper and lower limit values (1° C.). As described above, according to first example (the third embodiment), when the temperature is elevated, the temperature controllability is significantly improved as compared with that of the comparative example.

As shown in FIG. 13, the temperature control according to the first example (the third embodiment) is completed before the inner temperature of the furnace (for example, the temperature of the zone CU) reaches within the range of the upper and lower limit values during the temperature elevating. As a result, it is possible to suppress the overheating. However, according to the comparative example, the overshoot occurs and it takes time for the temperature of the zone CU to converge to the target temperature within the range of the upper and lower limit values.

As described above, in the temperature elevating step S3 of the first example, the control is performed by using both the heating by the heater 40 and the cooling by the cooling part 100 according to the third embodiment to keep the predetermined rate (10° C./minute in the first example). Therefore, it is possible to shorten the time for the temperature to converge to the target temperature within the range of the upper and lower limit values as compared with the comparative example (without the cooling part). In addition, according to the first example (third embodiment), it is possible to converge the temperature to the target temperature within the range of the upper and lower limit values even when the overshoot occurs. Therefore, according to the first example (third embodiment), it is possible to shift to the next processing step S4 faster than the comparative example, thereby improving the throughput.

Figure 14:
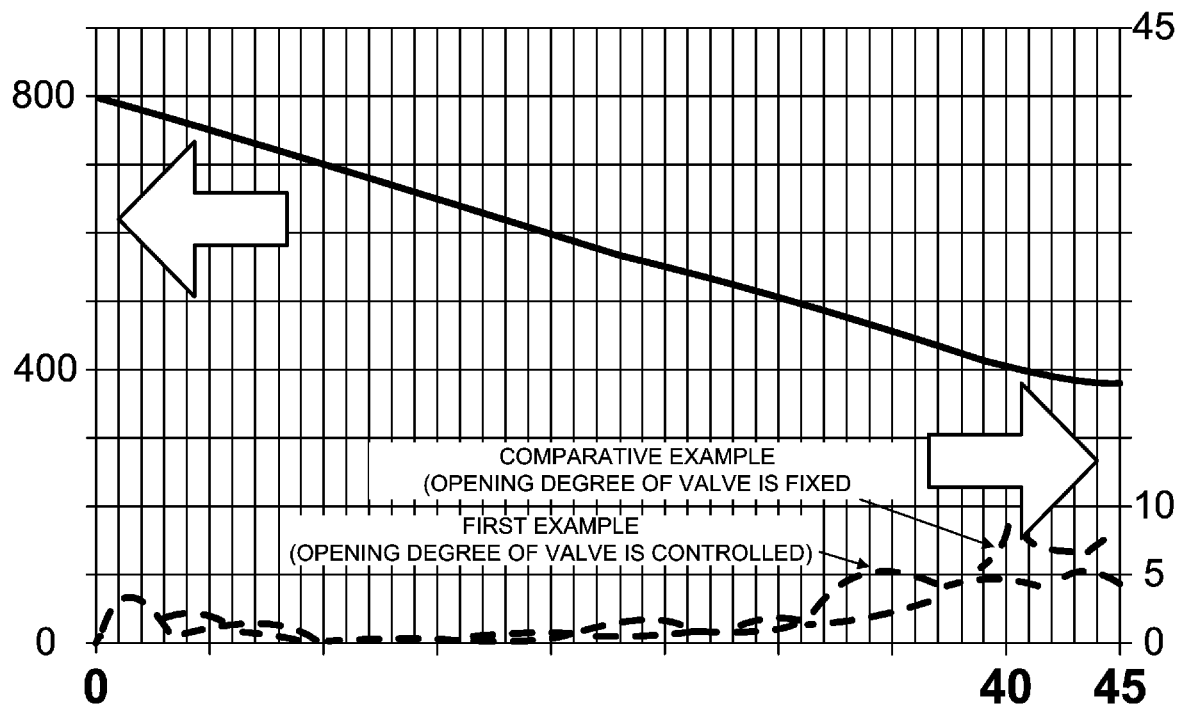
FIG. 14 schematically illustrates the temperature characteristics of the first example when the third embodiment is applied to a step S5 shown in FIG. 3.

FIG. 14 schematically illustrates the temperature characteristics of the first example when the temperature control using the cooling part in the third embodiment described above is applied to the temperature lowering step S5. In FIG. 14, the change of the inner temperature of the furnace in the temperature lowering step S5 according to the third embodiment described above (that is, the opening degree of the valve is controlled) is compared with that of a comparative example (that is, the opening degree of the valve is fixed to 100%).

In FIG. 14, the temperature change from the temperature lowering step S5 to the time before shifting to the next step (boat unloading step) S6 is exemplified by the average temperature of the inner temperatures of the furnace measured by the thermocouples provided in all of the zones. The horizontal axis of the graph shown in FIG. 14 represents the time (unit: minute), and the vertical axis of the graph shown in FIG. 14 represent the temperature (unit: ° C.). In particular, the vertical axis of the graph shown in FIG. 14 represents both of the inner temperature of the furnace and the temperature deviation. Although the comparison should be made without the cooling part as the comparative example, when the cooling is not used (that is, the temperature lowering step S5 is performed only by turning off the heater 40), it is difficult to lower the temperature at a rate of 10° C./minute. Thus, the third embodiment (that is, the opening degree of the valve is controlled) is compared with the comparative example (that is, the opening degree of the valve is fixed to 100%).

In FIG. 14, the temperature deviation between the zones from the temperature lowering step S5 to the time before shifting to the next step (boat unloading step) S6 is indicated by a dotted line, and the change of the average temperature of the inner temperatures of the furnace of all of the zones is indicated by a solid line. That is, in FIG. 14, the change of the temperature when the temperature is lowered from 800° C. to 400° C. at a temperature lowering rate of 10° C./minute is indicated. The change of the temperature shown in FIG. 14 is indicated by the average temperature of the inner temperatures of the furnace measured by the thermocouples of all of the zones. The change of the inner temperature of the furnace and the temperature deviation between the zones are almost equivalent in the comparative example and first example (the third embodiment).

However, in the comparative example, the heater power is applied and the heating is performed by the heater 40 so as to delay the temperature lowering to the rate of 10° C./minute. However, in the first example (the third embodiment), both of the cooling by the cooling air 90 and the heating by the heater are adjusted. Therefore, according to the first example (the third embodiment), it is possible to save the energy efficiently as compared with the comparative example in which the temperature lowering rate (10° C./minute) is controlled only by the heater power.

Figure 15:
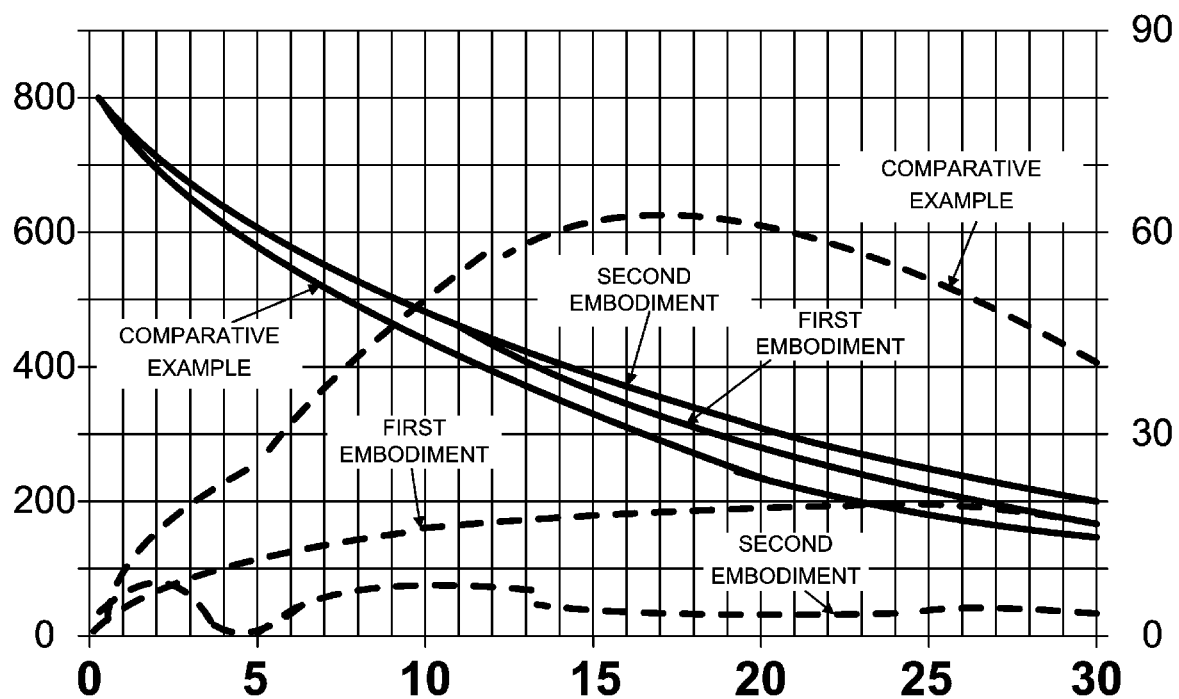
FIG. 15 schematically illustrates the temperature characteristics of a second example when the first embodiment and the second embodiment are applied to the step S5 shown in FIG. 3.

FIG. 15 schematically illustrates the temperature characteristics of the second example when the temperature control using the cooling part in the first embodiment and the second embodiment described above are applied to the temperature lowering step S5. In FIG. 15, the changes of the inner temperature of the furnace in the temperature lowering step S5 according to the first embodiment (that is, the opening degree of the valve is fixed for each of the cooling zones) and according to the second embodiment (that is, the opening degree of the valve is controlled) are compared with that of a comparative example (that is, the opening degree of the valve is fixed to 100% open).

In FIG. 15, as in FIG. 14, the temperature change (solid line) from the temperature lowering step S5 to the time before shifting to the next step (boat unloading step) S6 is exemplified by the average temperature of the inner temperatures of the furnace measured by the thermocouples provided in all of the zones. The horizontal axis of the graph shown in FIG. 15 represents the time (unit: minute), and the vertical axis of the graph shown in FIG. 15 represent the temperature (unit: ° C.). In particular, the vertical axis of the graph shown in FIG. 15 represents both of the inner temperature of the furnace and the temperature deviation. In FIG. 15, the change of the inner temperature of the furnace is illustrated when the temperature is lowered from 800° C. with the power of the heater 40 off (that is, the heater power is set to 0%).

As shown in FIG. 15, the time for the temperature to reach from 800° C. to 400° C. increases in the order of the supply amount of the cooling gas: specifically, about 12 minutes according to the comparative example (that is, the opening degree of the valve is fixed to 100% open), about 13 minutes according to the first embodiment (that is, the opening degree of the valve is fixed for each of the cooling zones) and about 14 minutes according to the second embodiment (that is, the opening degree of the valve is controlled).

In FIG. 15, the temperature deviation (dotted line) between the zones when the temperature is lowered from 800° C. with the power of the heater 40 off (that is, the heater power is set to 0%) is illustrated. Referring to the graph shown in FIG. 15, the temperature deviation between the zones of the comparative example (that is, the opening degree of the valve is fixed to 100% open) exceeds the maximum of 60° C. In addition, the temperature deviation between the zones of the comparative example is 20° C. or more from 3 minutes after the start of the temperature lowering from 800° C. Referring to the graphs shown in FIG. 15, the temperature deviation between the zones of the first embodiment (that is, the opening degree of the valve is fixed for each of the cooling zones) is about 20° C. from 10 minutes after the start of the temperature lowering from 800° C. Although the temperature deviation between the zones of the first embodiment (that is, the opening degree of the valve is fixed for each of the cooling zones) is reduced as compared with that of the comparative example (that is, the opening degree of the valve is fixed to 100% open), it seems that there is a limit in the control performed by fixing the opening degree of the valve for the cooling air 90 such as the control according to the first embodiment.

However, referring to the temperature deviation between the zones in the second embodiment (in which the opening degree of the valve is controlled) shown in FIG. 15, during the temperature lowering step S5, the maximum value of the temperature deviation between the zones does not exceed 10° C., and the average value of the temperature deviation between the zones is around 8° C.

That is, when the temperature history does not require much consideration after the process, by performing the temperature control using the cooling part 100 according to the second embodiment (or the first embodiment), it is possible to improve the throughput more than that of the third embodiment.

Figure 16:
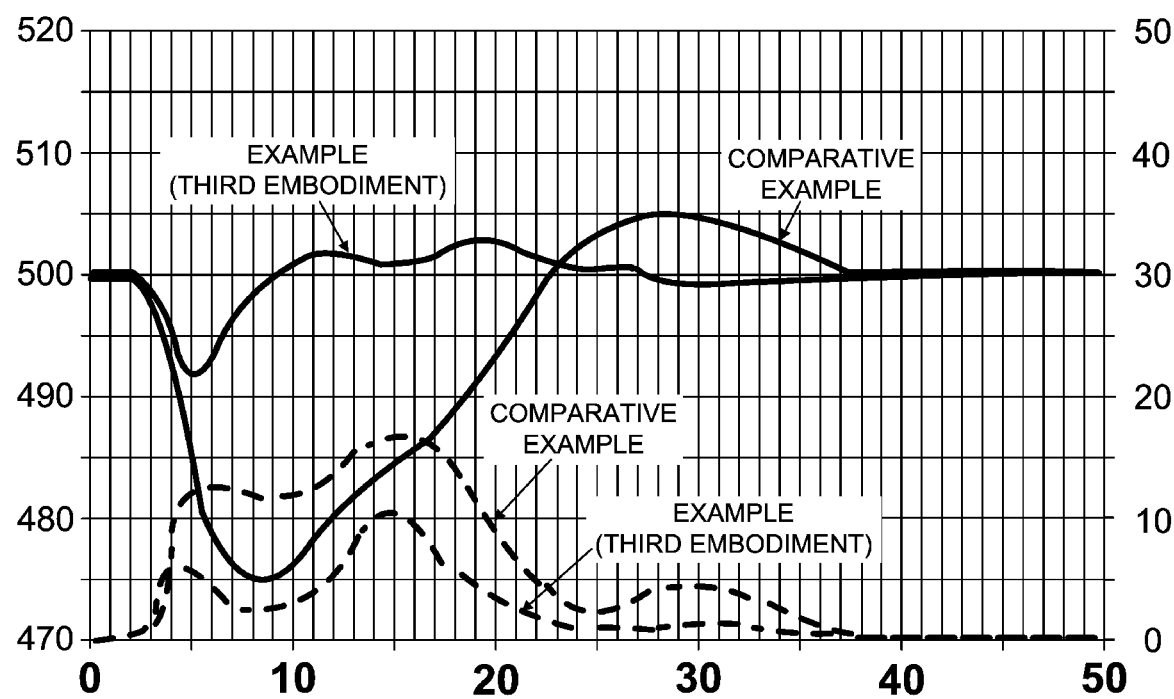
FIG. 16 schematically illustrates the temperature characteristics of an example when the third embodiment is applied to a step S2 shown in FIG. 3.

FIG. 16 schematically illustrates the temperature characteristics of an example when the temperature control using the cooling part 100 in the third embodiment described above is applied to the boat loading step S2. In FIG. 16, the change of the inner temperature of the furnace in the boat loading step S2 according to the example (third embodiment described above) is compared with that of a comparative example (without the cooling part). As shown in FIG. 16, according to the example (third embodiment), it is possible to shorten the temperature recovery time when the temperature drop due to the disturbance generated in the step S2 cannot be avoided.

In FIG. 16, the temperature change in the boat loading step S2 is exemplified by the temperature of the zone L1 among the plurality of control zones. The horizontal axis of the graph shown in FIG. 16 represents the time (unit: minute), and the vertical axis of the graph shown in FIG. 16 represent the temperature (unit: ° C.). In particular, the vertical axis of the graph shown in FIG. 16 represents both of the inner temperature of the furnace and the temperature deviation. In FIG. 16, the change of the inner temperature of the furnace (solid line) and the temperature deviation between the zones (dotted line) are illustrated when the boat 31 is loaded into the furnace while maintaining the temperature at 500° C.

As shown in FIG. 16, in the comparative example (without the cooling part), the maximum of the temperature drop is 25° C., and the maximum of the temperature deviation is about 20° C. However, in the temperature control using the cooling part according to the example (third embodiment) described above, the temperature drop is at most smaller than ° C., and the maximum of the temperature deviation is also about 10° C. In addition, the time that the temperature is stabilized again at 500° C. (±2° C.) is 21 minutes in the example (third embodiment) as compared with 35 minutes in the comparative example. In the temperature control using the cooling part according to the example (third embodiment) described above, it is possible to shorten the temperature recovery time when the temperature drop due to the disturbance generated in the step S2 cannot be avoided. Therefore, according to the example (third embodiment), it is possible to shift to the next temperature elevating S3 earlier than the comparative example, and to improve the throughput.

That is, when the boat loading step S2 is performed at a relatively low temperature (for example, 500° C. in FIG. 16), in the comparative example, the power is excessively output against the temperature fluctuation due to the boat loading disturbance. Therefore, the temperature is higher than the setting value, and the power of the heater 40 is turned off (that is, the heater power is set to 0%) to reduce the power. When the power of the heater 40 is off (that is, the heater power is set to 0%), it takes a long time until the inner temperature of the furnace falls to the setting value and the temperature recovery time is increased. However, in the control of the cooling part 100 according to the example (the third embodiment), it is possible to output a constant power by strengthening the cooling (that is, by opening the valve) when the power output (power value) is equal to or less than a preset power value and by weakening the cooling (that is, by closing the valve) when the power output is equal to or greater than the preset power value. As a result, as compared with the comparative example, it is possible to shorten the time duration during which the power of the heater 40 is off (that is, the heater power is set to 0%), and it is also possible to increase or decrease the power value with respect to the temperature fluctuations due to the disturbance. Therefore, it is possible to improve the temperature controllability, and to shorten the temperature recovery time.

In addition, when the temperature control using the cooling part according to the third embodiment described above is applied to the step (boat unloading step) S6, it is also possible to shorten the temperature recovery time as compared with the comparative example.

The technique described above by the embodiments and the examples may be applied not only to a semiconductor manufacturing apparatus but also to an apparatus of processing a glass substrate such as an LCD apparatus. For example, the technique may be applied to a substrate processing apparatus used for processing a semiconductor wafer on which semiconductor integrated circuit devices (semiconductor devices) are fabricated by performing processes such as an oxidation process, a diffusion process, an annealing process or a reflow process for the carrier activation and the planarization after the ion implantation, and a film-forming process by a thermal CVD reaction.

The technique described above by the embodiments and the examples can be applied to a processing apparatus as long as the substrate to be processed is accommodated in a process chamber of the processing apparatus and heated by a heater of the processing apparatus.

According to some embodiments in the present disclosure, it is possible to improve the temperature deviation between the control zones and to improve the temperature stability of the substrate.

What is claimed is:

1. A substrate processing apparatus comprising:
   a heater configured to heat a substrate in a reaction tube;
   a temperature controller configured to control the heater such that the substrate is maintained at a predetermined temperature while an operation amount (Z) outputted to the heater is being calculated;
   a valve controller configured to adjust an opening degree of a control valve to adjust a flow rate of a gas supplied toward the reaction tube; and
   a main controller configured to output a setting value to at least one of the temperature controller and the valve controller to control an inner temperature of the reaction tube,
   wherein the valve controller comprises: a subtractor configured to calculate a deviation (Zd) by subtracting the operation amount (Z) from a power setting value set by the main controller; and an opening degree converter configured to calculate an opening degree (X') based on an operation result obtained by performing an operation using the deviation (Zd), and
   wherein the opening degree (X') based on the operation result is controlled such that the deviation (Zd) becomes zero.

2. The substrate processing apparatus of claim 1, further comprising:
   a cooling structure divided into a plurality of cooling zones, wherein the control valve is installed in each of the plurality of cooling zones,
   wherein the opening degree of the control valve of each of the plurality of cooling zones is controlled independently according to the plurality of cooling zones.

3. The substrate processing apparatus of claim 2, wherein the heater comprises a plurality of control zones, and number of the control zones is equal to number of the cooling zones.

4. The substrate processing apparatus of claim 3, further comprises a plurality of thermocouples provided respectively in the plurality of control zones,
   wherein the main controller is further configured to control the temperature controller and the valve controller such that a temperature deviation between a first temperature detected by a thermocouple configured to detect a temperature of a reference zone selected among the plurality of control zones and a second temperature detected by a thermocouple provided among the plurality of control zones other than the reference zone is equal to zero.

5. The substrate processing apparatus of claim 4, wherein the temperature controller is further configured to control the control valve such that a deviation between the first temperature and a reference setting value calculated based on a previous setting value of the main controller is zero.

6. The substrate processing apparatus of claim 2, wherein the cooling structure comprises:
   a plurality of opening holes wherethrough the gas is ejected to the reaction tube;
   a plurality of inlet pipes respectively provided at the plurality of cooling zones; and
   a ring-shaped buffer part configured to temporarily store therein the gas supplied through the plurality of inlet pipes.

7. The substrate processing apparatus of claim 6, wherein the main controller is further configured to open or close the control valve to control a flow rate and a flow velocity of the gas ejected to the reaction tube through the plurality of opening holes.

8. The substrate processing apparatus of claim 6, wherein each of the plurality of inlet pipes is provided with a back-diffusion prevention part configured to prevent a back-diffusion of an inner atmosphere of the reaction tube.

9. The substrate processing apparatus of claim 6, wherein a cross-sectional area of a flow path of each of the plurality of inlet pipes is greater than a total cross-sectional area of the plurality of opening holes.

10. The substrate processing apparatus of claim 6, wherein the plurality of opening holes are provided throughout the plurality of cooling zones with a same interval therebetween along a circumferential direction.

11. The substrate processing apparatus of claim 6, wherein the plurality of opening holes are provided throughout the plurality of cooling zones with a same interval therebetween along a vertical direction.

12. The substrate processing apparatus of claim 1, wherein the main controller is further configured to control the temperature controller and the valve controller such that a heating by the heater and a cooling by the gas supplied through the control valve are performed in parallel.

13. The substrate processing apparatus of claim 1, wherein the main controller is further configured to control the temperature controller and the valve controller to execute a recipe comprising the steps of: (a) elevating the inner temperature of the reaction tube to the predetermined temperature at a predetermined temperature elevating rate; (b) processing the substrate at the predetermined temperature; and (c) lowering the inner temperature of the reaction tube from the predetermined temperature at a predetermined temperature lowering rate.

14. The substrate processing apparatus of claim 13, wherein the main controller is further configured to control the temperature controller and the valve controller so as to shorten a duration of time for an overshoot generated during a transition from step (a) to step (b) to be stabilized to the predetermined temperature.

15. The substrate processing apparatus of claim 13, wherein the main controller is further configured to control the valve controller so as to shorten a time duration of step (c) by performing a cooling by the gas supplied through the control valve.

16. The substrate processing apparatus of claim 13, wherein the main controller is further configured to control the valve controller so as to stop a supply of the gas supplied through the control valve before the inner temperature of the reaction tube reaches the predetermined temperature in step (a).

17. The substrate processing apparatus of claim 13, wherein the recipe further comprises the step of: (d) loading a boat accommodating a plurality of substrates comprising the substrate into the reaction tube, and the main controller is further configured to control the temperature controller and the valve controller so as to shorten a time duration of a temperature overshoot generated during step (d).

* * * * *